United States Patent
Suomela

(10) Patent No.: US 9,431,839 B2
(45) Date of Patent: Aug. 30, 2016

(54) METHOD, APPARATUS, AND COMPUTER PROGRAM PRODUCT FOR OPTIMIZED DEVICE-TO-DEVICE CHARGING

(71) Applicant: Nokia Corporation, Espoo (FI)

(72) Inventor: Riku Suomela, Espoo (FI)

(73) Assignee: Nokia Technologies Oy, Espoo (FI)

( * ) Notice: Subject to any disclaimer, the term of this patent is extended or adjusted under 35 U.S.C. 154(b) by 651 days.

(21) Appl. No.: 13/661,428

(22) Filed: Oct. 26, 2012

(65) Prior Publication Data

US 2014/0117921 A1    May 1, 2014

(51) Int. Cl.
| | |
|---|---|
| *H02J 7/00* | (2006.01) |
| *H02J 7/02* | (2016.01) |
| *H04B 5/00* | (2006.01) |
| *G01R 31/36* | (2006.01) |

(52) U.S. Cl.
CPC ............. *H02J 7/0054* (2013.01); *H02J 7/0004* (2013.01); *H02J 7/025* (2013.01); *H04B 5/0031* (2013.01); *H04B 5/0037* (2013.01); *H04B 5/0075* (2013.01); *G01R 31/3689* (2013.01); *H02J 7/0047* (2013.01); *H02J 2007/0096* (2013.01); *H04B 5/0012* (2013.01)

(58) Field of Classification Search
USPC .......................................................... 320/103
IPC .......................................... H02J 7/0055,7/0057
See application file for complete search history.

(56) References Cited

U.S. PATENT DOCUMENTS

| | | | |
|---|---|---|---|
| 6,433,515 B2 * | 8/2002 | Sakakibara | 320/137 |
| 2006/0022639 A1 * | 2/2006 | Moore | 320/116 |
| 2007/0236975 A1 | 10/2007 | Lippojoki et al. | |
| 2009/0023480 A1 | 1/2009 | Nandi et al. | |
| 2011/0225073 A1 | 9/2011 | Won et al. | |
| 2012/0062181 A1 | 3/2012 | Lee et al. | |

FOREIGN PATENT DOCUMENTS

EP    1158 593    11/2001

OTHER PUBLICATIONS

Extended European Search Report for Application No. 13188666.5-1806 dated Mar. 11, 2014.

\* cited by examiner

*Primary Examiner* — Samuel Berhanu
(74) *Attorney, Agent, or Firm* — Locke Lord LLP

(57) ABSTRACT

Method, apparatus, and computer program product example embodiments provide device-to-device charging. According to an example embodiment of the invention, a method comprises receiving, by a first device, a user's selection of a charging criterion for balancing stored charges in the first device's own battery and in a second device's rechargeable battery; determining, by the first device, that recharging of the second device's rechargeable battery is required; computing, by the first device, an amount of charging required for the second device's rechargeable battery, in order to satisfy the user's selected charging criterion; and transmitting, by the first device, power provided by the first device's own battery, to the second device, for charging the second device's rechargeable battery until the present level of stored battery charge in the second device's rechargeable battery reaches the computed amount of charging required.

18 Claims, 22 Drawing Sheets

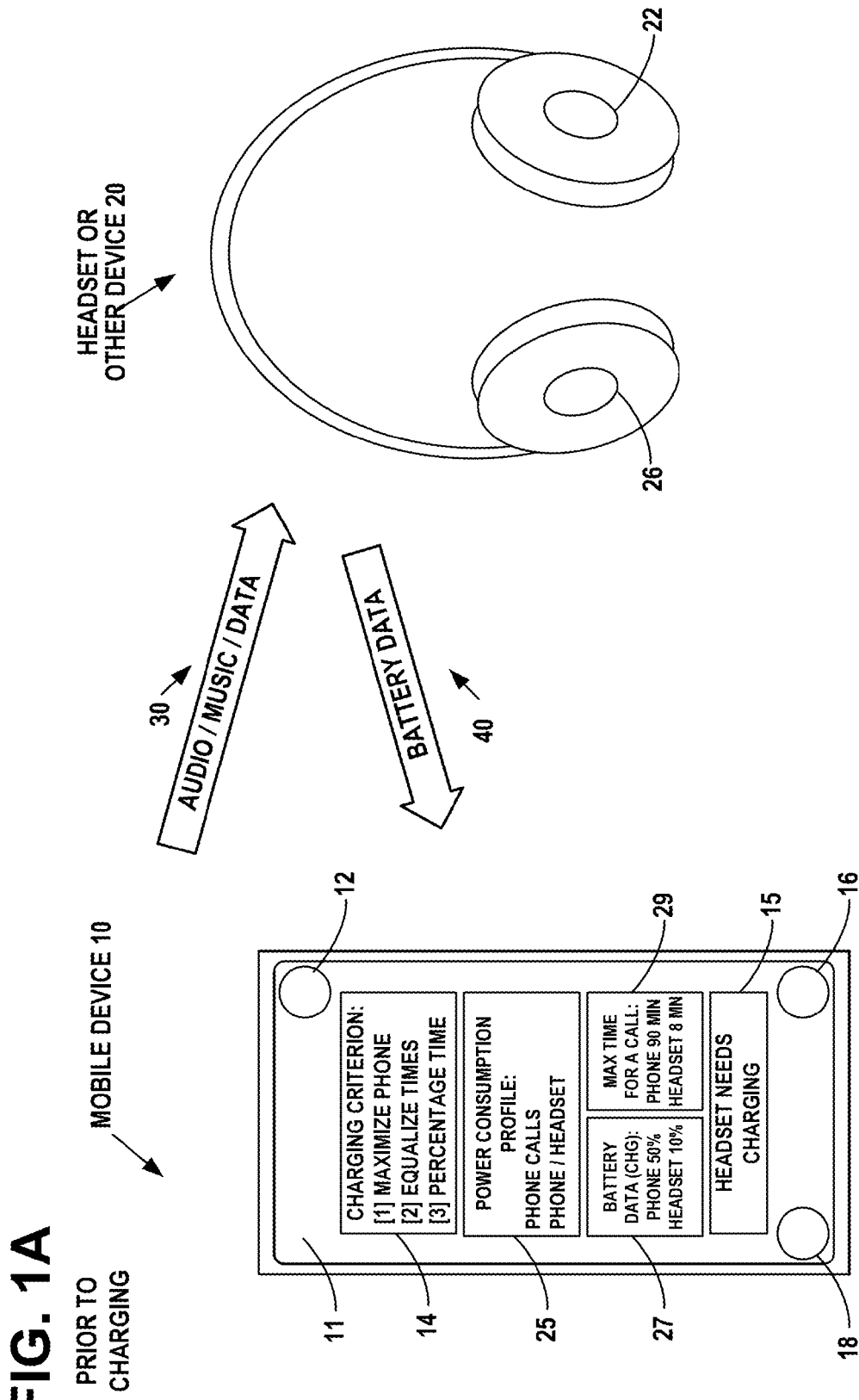

WHILE CHARGING

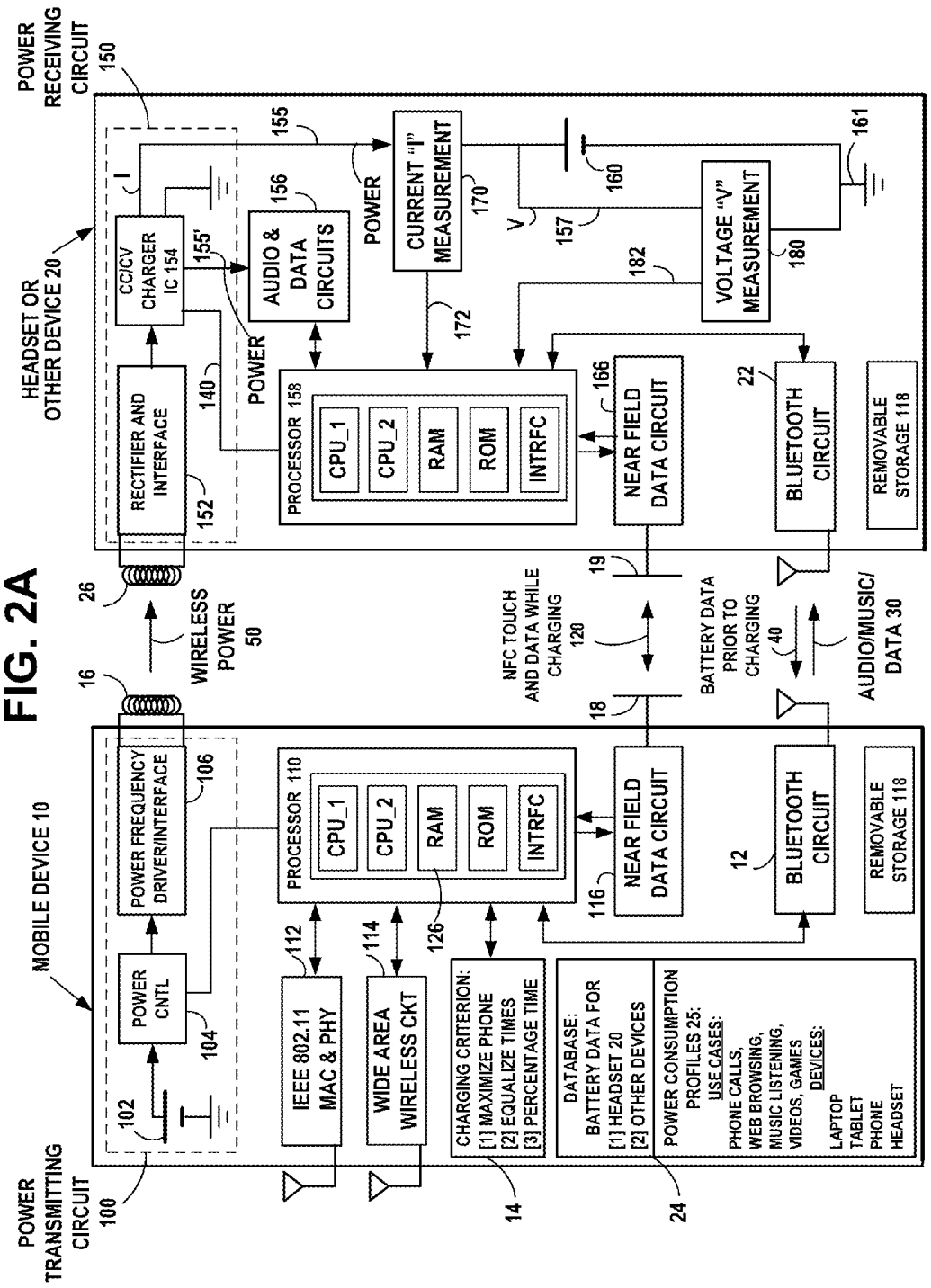

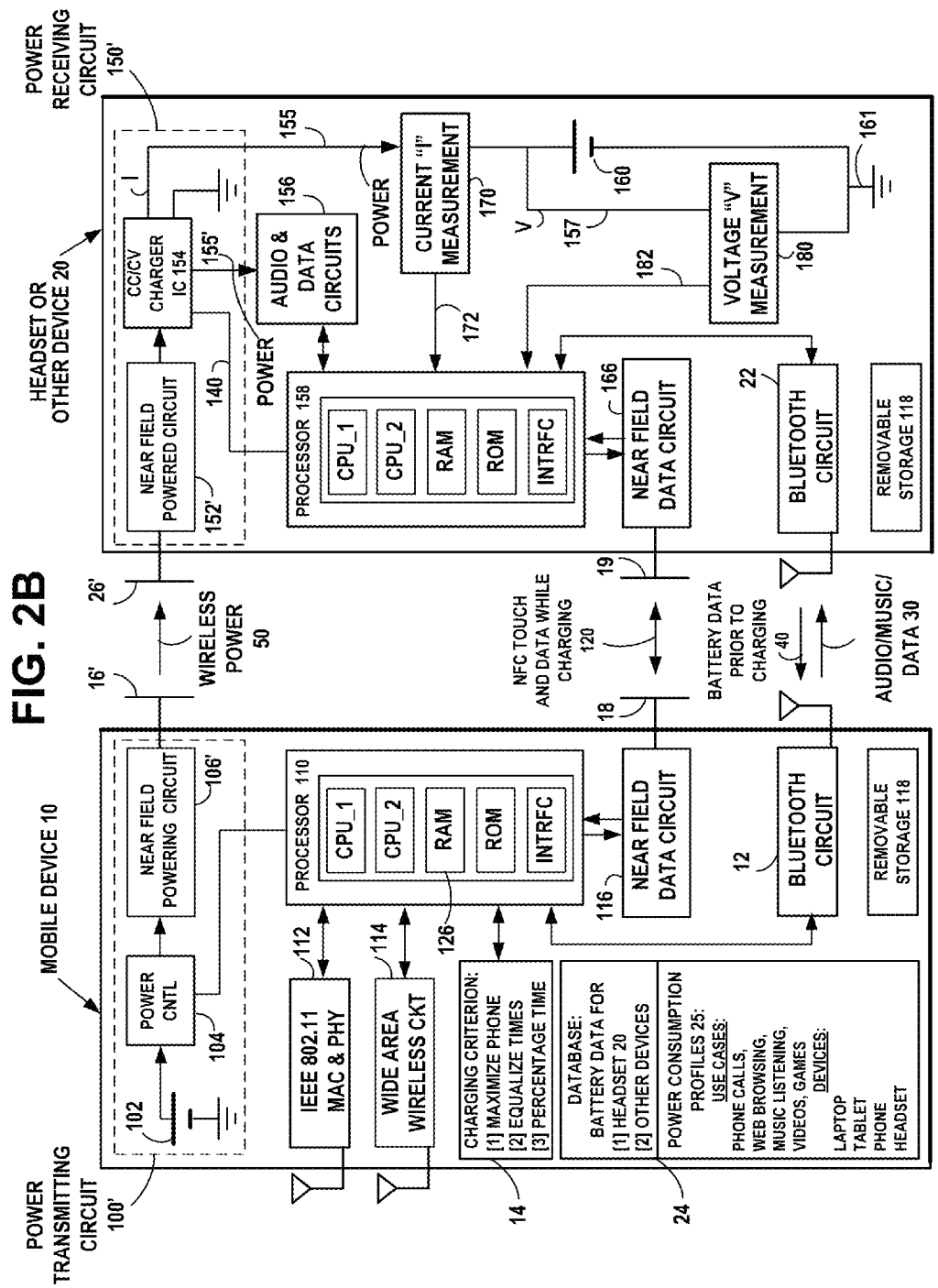

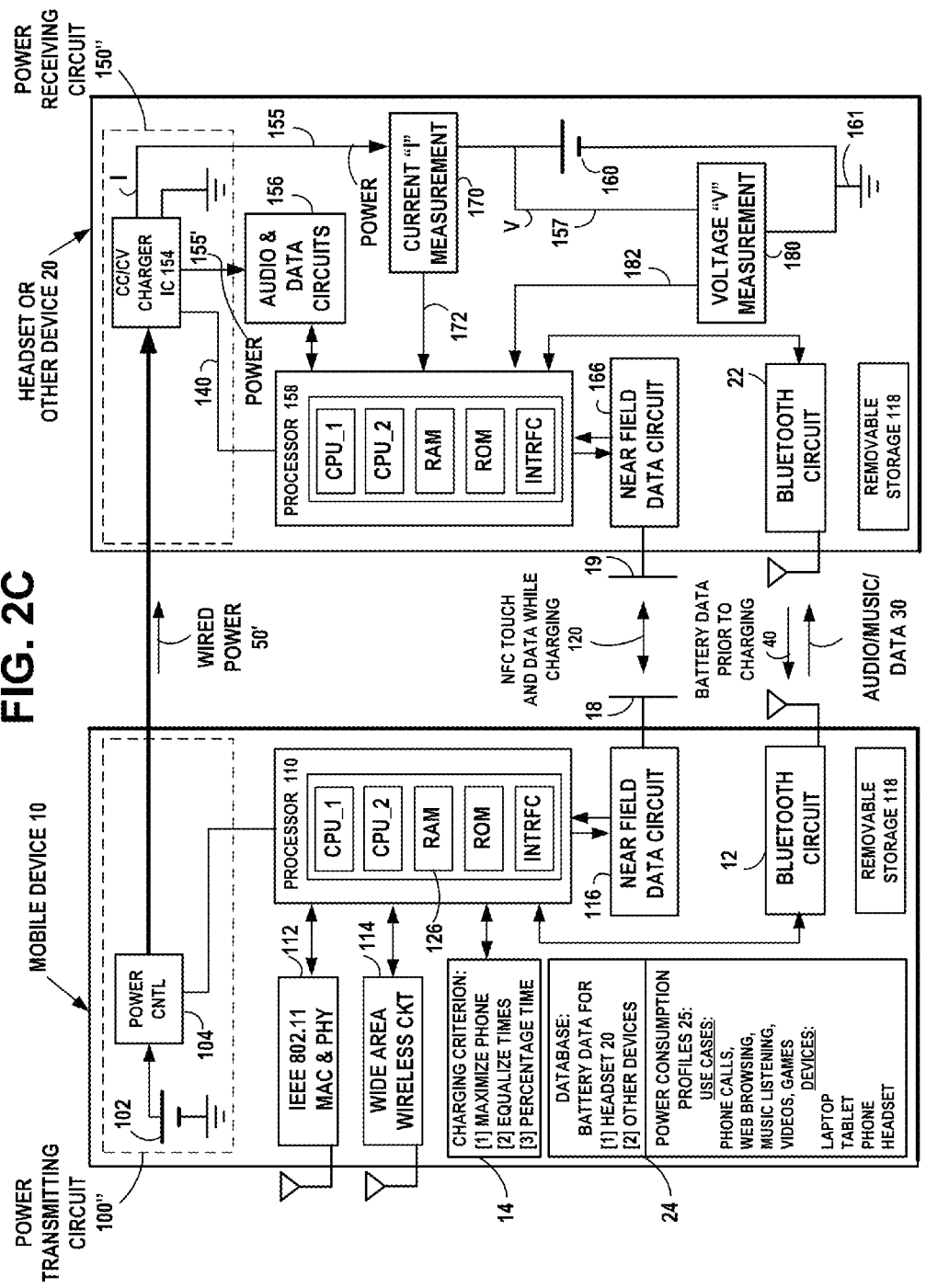

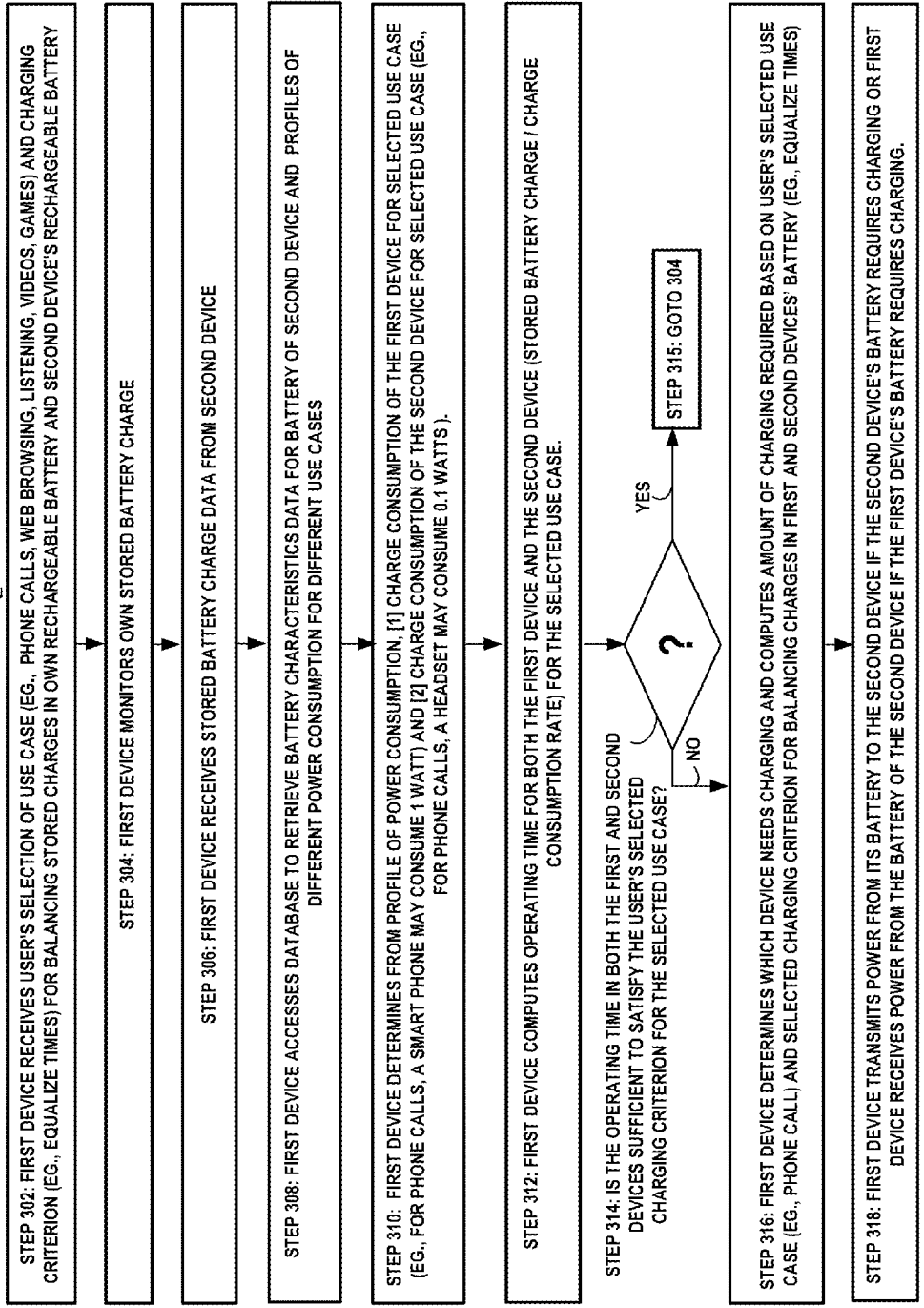

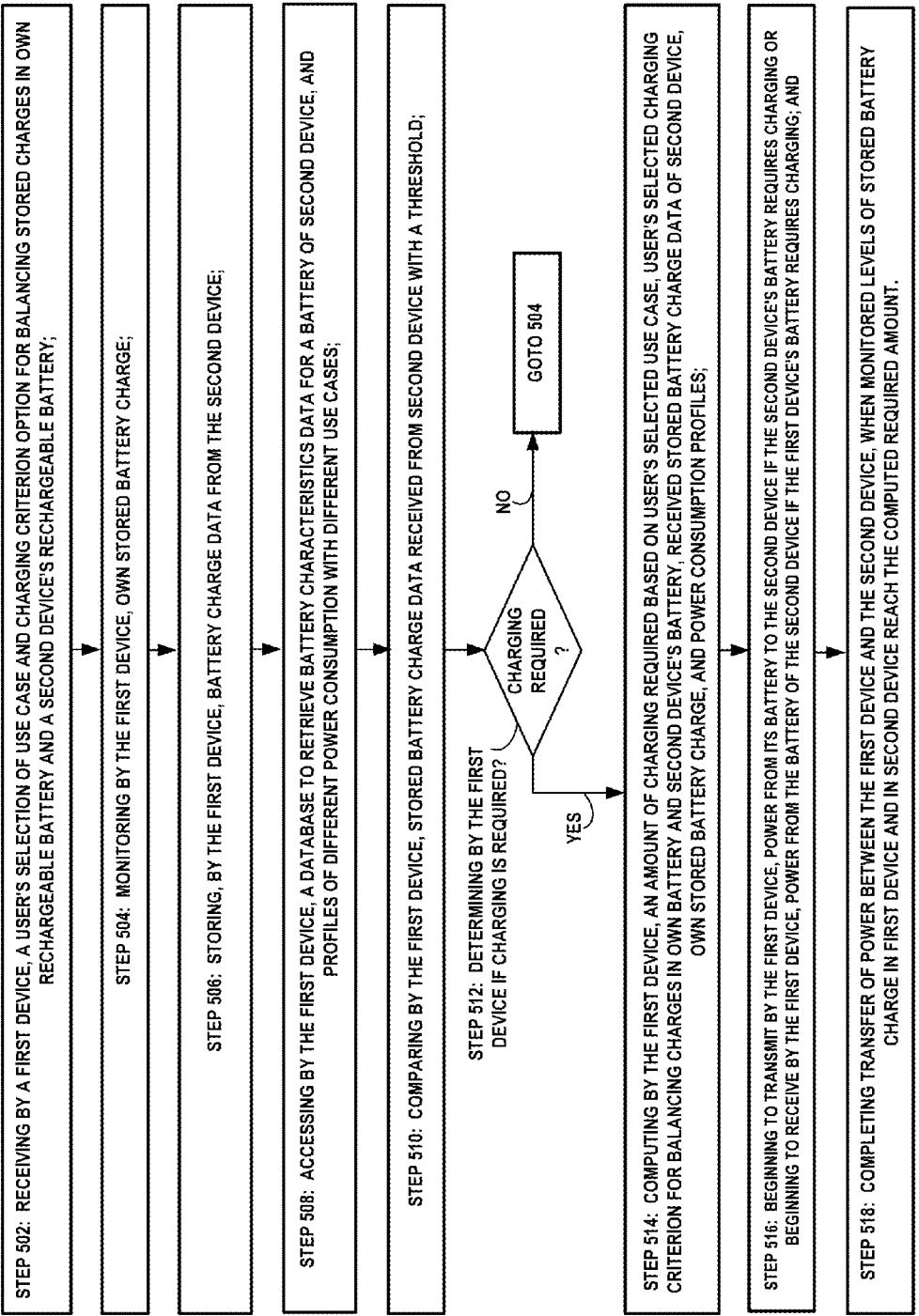

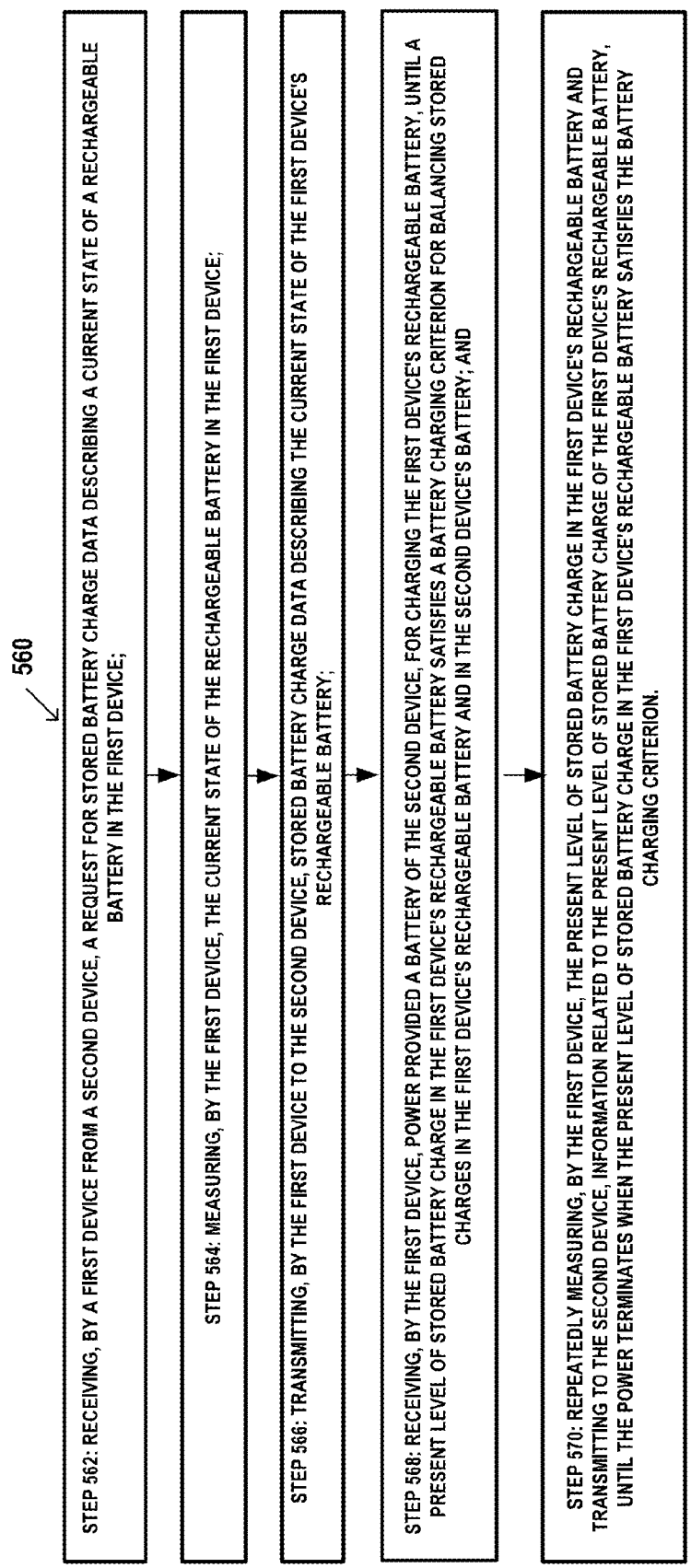

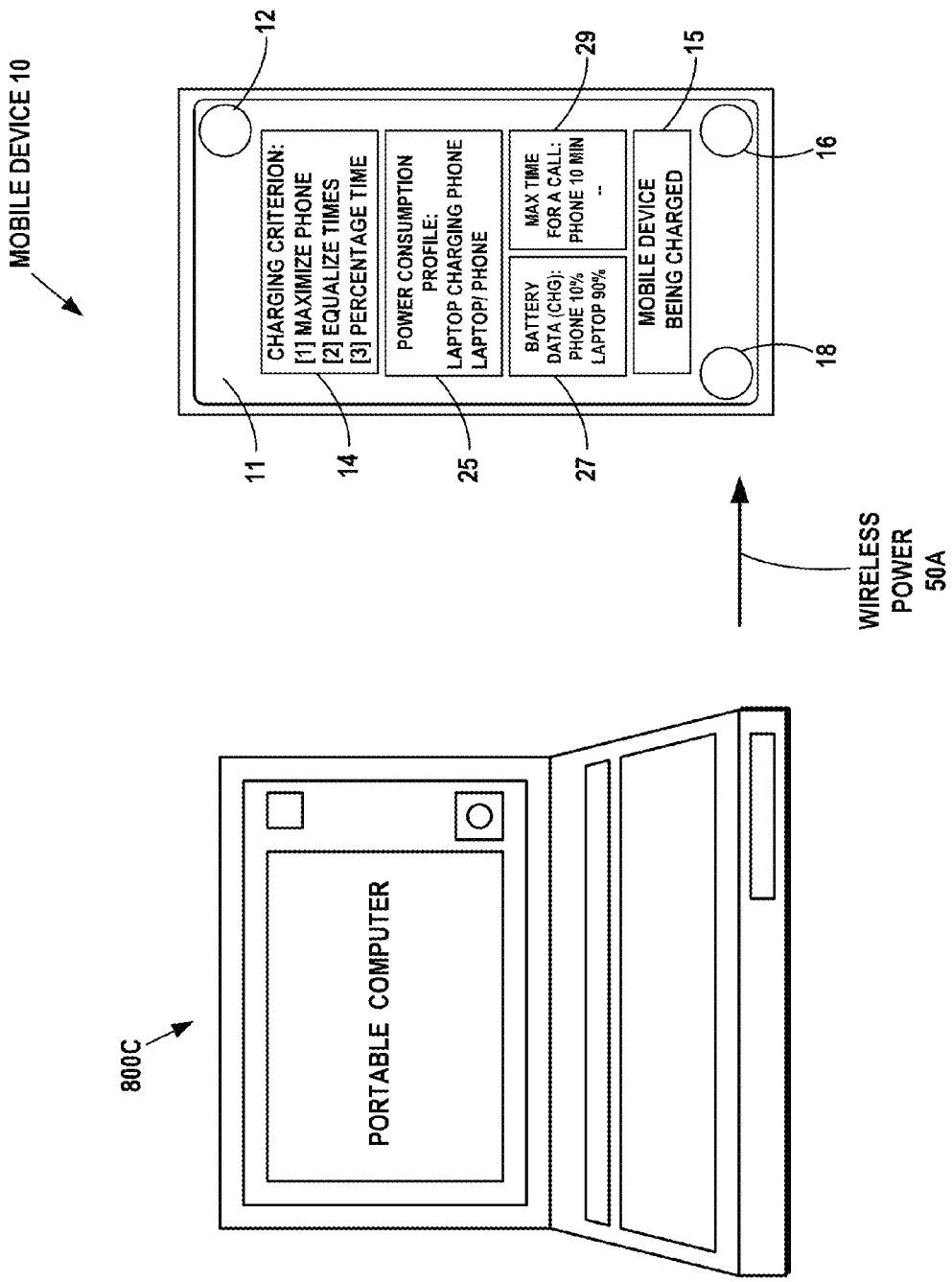

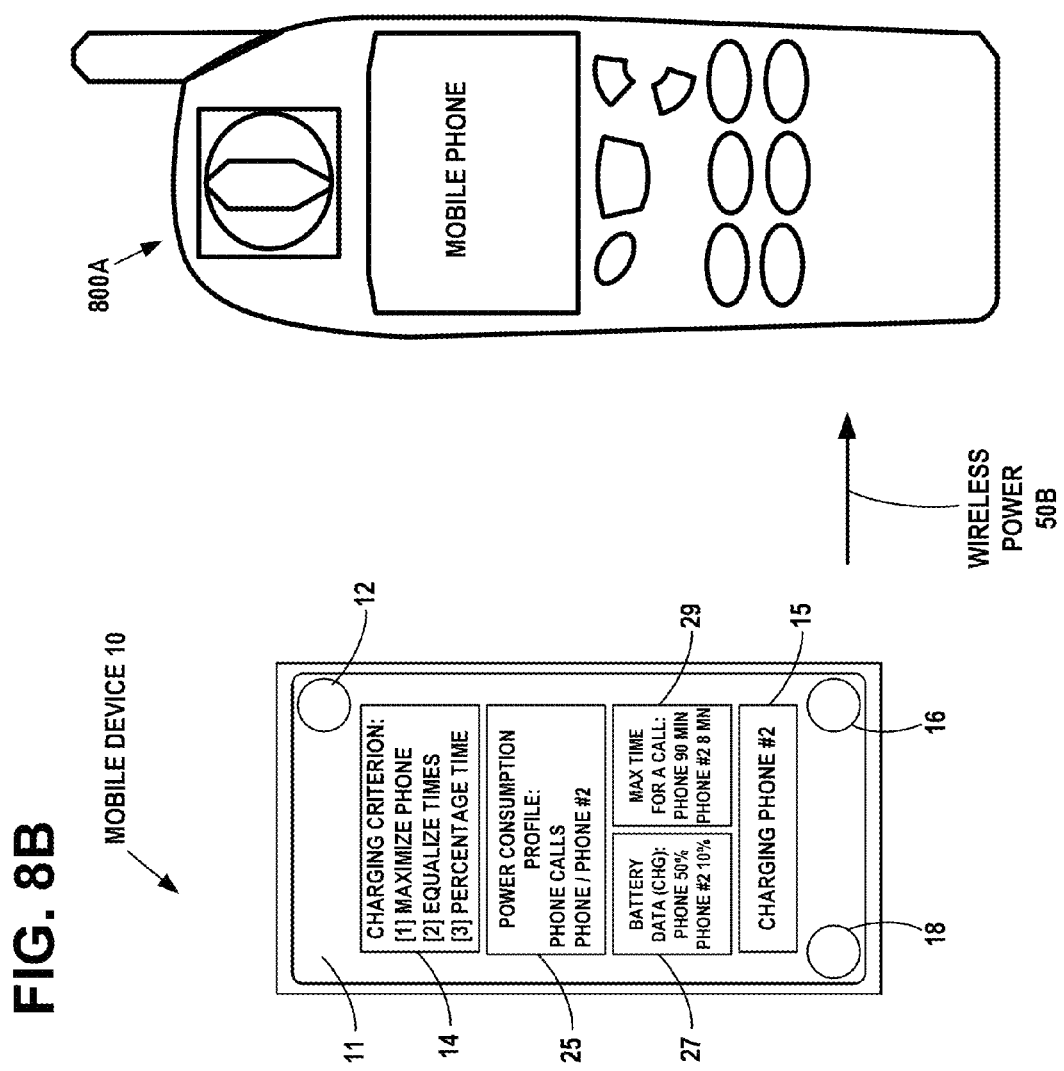

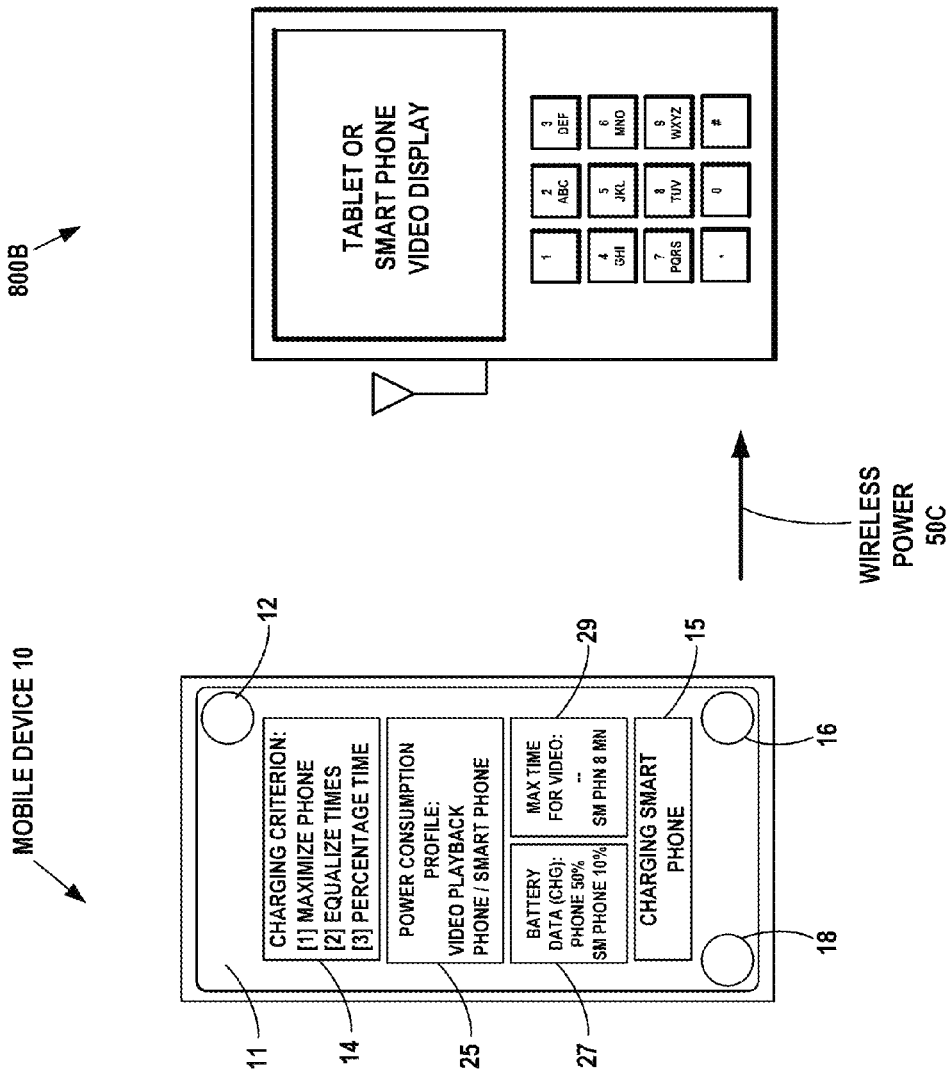

METHOD, APPARATUS, AND COMPUTER PROGRAM PRODUCT FOR OPTIMIZED DEVICE-TO-DEVICE CHARGING

FIELD

The field of the invention relates to wireless short-range communication and more particularly to device-to-device charging.

BACKGROUND

Modern society has adopted, and is becoming reliant upon, wireless communication devices for various purposes, such as connecting users of the wireless communication devices with other users. Wireless communication devices can vary from battery powered handheld devices to stationary household and/or commercial devices utilizing an electrical network as a power source. Due to rapid development of the wireless communication devices, a number of areas capable of enabling entirely new types of communication applications have emerged.

Cellular networks facilitate communication over large geographic areas. These network technologies have commonly been divided by generations, starting in the late 1970s to early 1980s with first generation (1G) analog cellular telephones that provided baseline voice communications, to modern digital cellular telephones. GSM is an example of a widely employed 2G digital cellular network communicating in the 900 MHZ/1.8 GHZ bands in Europe and at 850 MHz and 1.9 GHZ in the United States. While long-range communication networks, like GSM, are a well-accepted means for transmitting and receiving data, due to cost, traffic and legislative concerns, these networks may not be appropriate for all data applications.

Bluetooth™ is an example of a short-range wireless technology quickly gaining acceptance in the marketplace. In addition to Bluetooth™ other short-range communication technologies include Bluetooth™ Low Energy, IEEE 802.11 wireless local area network (WLAN), Wireless USB, ZigBee (IEEE 802.15.4, IEEE 802.15.4a), and ultra-high frequency radio frequency identification (UHF RFID) technologies. All of these wireless communication technologies have features and advantages that make them appropriate for various applications.

An example of a wireless short-range communication technology is Bluetooth™ communication protocol, which operates in the 2.4 GHz ISM band. Bluetooth™ is a short-range radio network, originally intended as a cable replacement. Bluetooth™ Technical Specifications are published by the Bluetooth™ SIG, Inc. The *Bluetooth™ Core Specification, Version* 4.0 includes the Extended Inquiry Response. An Extended Inquiry Response may be used to provide miscellaneous information during the inquiry response procedure. Data types may be defined for such things as local name and supported services, information that otherwise would have to be obtained by establishing a connection. A device that receives a local name and a list of supported services in an extended inquiry response does not have to connect to do a remote name request and a service discovery protocol (SDP) service search, thereby shortening the time to useful information.

Near field communication technologies, such as radio frequency identification (RFID) technologies, comprise a range of RF transmission systems, for example standardized and proprietary systems for a large number of different purposes, such as product tagging for inventory handling and logistics, theft prevention purposes at the point of sale, and product recycling at the end of the life-cycle of the tagged product. In addition to RFID technologies, Near Field Communication (NFC) technology has recently evolved from a combination of existing contactless identification and interconnection technologies. NFC is both a "read" and "write" technology. Communication between two NFC-compatible devices occurs when they are brought within close proximity of each other: A simple wave or touch can establish an NFC connection that may be used to exchange specific information for another communications protocol, which may then be used to create an actual connection in the other communications protocol, such as Bluetooth™ or wireless local area network (WLAN).

Batteries are essential for the portability of wireless terminals, for example cellular phones, wireless headsets, and other portable communication devices. Rechargeable batteries in cellular phones, wireless headsets, and other portable communication devices, such as NiCd, nickel-metal hydride (NiMH), lithium iron phosphate ($LiFePO_4$), Lithium-ion, and Lithium-Polymer batteries, may be recharged with household alternating current (AC) power coupled through a voltage reduction transformer, an alternating-to-direct current converter, and appropriate battery monitoring and charging circuits.

SUMMARY

Method, apparatus, and computer program product example embodiments provide device-to-device charging.

An example embodiment of the invention includes a method comprising:

receiving, by a first device, a user's selection of a charging criterion for balancing stored charges in the first device's own battery and in a second device's rechargeable battery;

determining, by the first device, that recharging of the second device's rechargeable battery is required;

computing, by the first device, an amount of charging required for the second device's rechargeable battery, in order to satisfy the user's selected charging criterion; and transmitting, by the first device, power provided by the first device's own battery, to the second device, for charging the second device's rechargeable battery until the present level of stored battery charge in the second device's rechargeable battery reaches the computed amount of charging required.

An example embodiment of the invention includes a method comprising:

transmitting, by the first device to the second device, a request for stored battery charge data describing a current state of the rechargeable battery in the second device;

receiving, by the first device, stored battery charge data from the second device describing the current state of its rechargeable battery;

accessing, by the first device, a database, to retrieve battery characteristic data for the second device's rechargeable battery;

comparing, by the first device, the stored battery charge data received from the second device with a recharging threshold; and determining, by the first device, that recharging of the second device's rechargeable battery is required, based on the comparison.

An example embodiment of the invention includes a method comprising:

monitoring, by the first device, a present level of stored battery charge in the second device's rechargeable battery and a present level of stored battery charge in the first device's own battery; and terminating, by the first device, the transmitting of power to the second device, when the present level of stored battery charge in the second device's rechargeable battery reaches the computed amount of charging required for the second device's rechargeable battery.

An example embodiment of the invention includes a method comprising:

wherein the retrieved battery characteristic data for the second device's rechargeable battery, includes battery maximum capacity and recharging threshold data, for the second device's rechargeable battery.

An example embodiment of the invention includes a method comprising:

wherein the recharging threshold includes an accessed battery maximum capacity and an accessed recharging threshold data for the second device's rechargeable battery.

An example embodiment of the invention includes a method comprising:

wherein the computing of the amount of charging required for the second device's rechargeable battery is based on the received stored battery charge data describing the second device's rechargeable battery, an accessed maximum capacity of the second device's rechargeable battery, and stored battery charge in the first device's own battery.

An example embodiment of the invention includes a method comprising:

accessing, by the first device, a database, to retrieve battery characteristic data for at least one of the first device's battery and the second device's battery, including at least one profile of different power consumption with different use cases; and computing the amount of charging required for the second device's rechargeable battery, based on the at least one profile of different power consumption with different use cases.

An example embodiment of the invention includes a method comprising:

wherein the power provided by the first device's own battery, to the second device, is at least one of power transmitted wirelessly to the second device or power transmitted via a wire to the second device.

An example embodiment of the invention includes a method comprising:

wherein the first device is either mobile or stationary and the second device is either mobile or stationary.

An example embodiment of the invention includes an apparatus comprising:

at least one processor;

at least one memory including computer program code;

the at least one memory and the computer program code configured to, with the at least one processor, cause the apparatus at least to:

receive a user's selection of a charging criterion for balancing stored charges in the apparatus' own battery and in a second device's rechargeable battery;

determine that recharging of the second device's rechargeable battery is required;

compute an amount of charging required for the second device's rechargeable battery, in order to satisfy the user's selected charging criterion; and transmit power provided by the apparatus' own battery, to the second device, for charging the second device's rechargeable battery until the present level of stored battery charge in the second device's rechargeable battery reaches the computed amount of charging required.

An example embodiment of the invention includes an apparatus comprising:

the at least one memory and the computer program code configured to, with the at least one processor, cause the apparatus at least to:

transmit to the second device, a request for stored battery charge data describing a current state of the rechargeable battery in the second device;

receive stored battery charge data from the second device describing the current state of its rechargeable battery;

access a database, to retrieve battery characteristic data for the second device's rechargeable battery;

compare the stored battery charge data received from the second device with a recharging threshold; and determine that recharging of the second device's rechargeable battery is required, based on the comparison.

An example embodiment of the invention includes an apparatus comprising:

the at least one memory and the computer program code configured to, with the at least one processor, cause the apparatus at least to:

monitor a present level of stored battery charge in the second device's rechargeable battery and a present level of stored battery charge in the apparatus' own battery; and terminate the transmitting of power to the second device, when the present level of stored battery charge in the second device's rechargeable battery reaches the computed amount of charging required for the second device's rechargeable battery.

An example embodiment of the invention includes an apparatus comprising:

wherein the retrieved battery characteristic data for the second device's rechargeable battery, includes battery maximum capacity and recharging threshold data, for the second device's rechargeable battery.

An example embodiment of the invention includes an apparatus comprising:

wherein the recharging threshold includes an accessed battery maximum capacity and an accessed recharging threshold data for the second device's rechargeable battery.

An example embodiment of the invention includes an apparatus comprising:

wherein the computing of the amount of charging required for the second device's rechargeable battery is based on the received stored battery charge data describing the second device's rechargeable battery, an accessed maximum capacity of the second device's rechargeable battery, and stored battery charge in the apparatus' battery.

An example embodiment of the invention includes an apparatus comprising:

the at least one memory and the computer program code configured to, with the at least one processor, cause the apparatus at least to:

access a database, to retrieve battery characteristic data for at least one of the apparatus' battery and the second device's battery, including at least one profile of different power consumption with different use cases; and compute the amount of charging required for the second device's rechargeable battery, based on the at least one profile of different power consumption with different use cases.

An example embodiment of the invention includes an apparatus comprising:

wherein the power provided by the first device's own battery, to the second device, is at least one of power transmitted wirelessly to the second device or power transmitted via a wire to the second device.

An example embodiment of the invention includes an apparatus comprising:

wherein the first device is either mobile or stationary and the second device is either mobile or stationary.

An example embodiment of the invention includes a method comprising:

receiving, by a first device, a user's selection of a charging criterion for balancing stored charges in the first device's own rechargeable battery and in a second device's rechargeable battery;

determining, by the first device, that recharging of the first device's own rechargeable battery is required;

computing, by the first device, an amount of charging required for the first device's own rechargeable battery, in order to satisfy the user's selected charging criterion; and receiving, by the first device, power provided by a battery of the second device, for charging the first device's rechargeable battery, until a present level of stored battery charge in the first device's rechargeable battery satisfies a battery charging criterion for balancing stored charges in the first device's rechargeable battery and in the second device's battery.

An example embodiment of the invention includes an apparatus comprising:

at least one processor;

at least one memory including computer program code;

the at least one memory and the computer program code configured to, with the at least one processor, cause the apparatus at least to:

receive a user's selection of a charging criterion for balancing stored charges in a first device's own rechargeable battery and in a second device's rechargeable battery;

determine that recharging of the first device's rechargeable battery is required;

compute an amount of charging required for the first device's own rechargeable battery, in order to satisfy the user's selected charging criterion; and receive power provided by a battery of the second device, for charging the first device's rechargeable battery, until a present level of stored battery charge in the first device's rechargeable battery satisfies a battery charging criterion for balancing stored charges in the first device's rechargeable battery and in the second device's battery.

The example embodiments of the invention provide device-to-device charging.

DESCRIPTION OF THE FIGURES

FIG. 1A discloses an example view illustrating an example first device, a wireless mobile device, communicating with an example second device, a wireless headset or other device, having a rechargeable battery, prior to charging, the mobile device being programmed to provide its user with charging criterion options for balancing stored charges in its own rechargeable battery and in the headset's or other device's rechargeable battery, the figure further showing wireless charging device the mobile device receiving stored battery charge data from headset's or other device's rechargeable battery, the figure further showing the mobile device displaying a notice to its user that the headset or other device needs recharging, in accordance with at least one embodiment of the present invention.

FIG. 2A discloses an example network and functional block diagram of the example first device, the wireless mobile device, communicating the example second device, the wireless headset or other device of FIG. 1B, showing the transfer of wireless power from the mobile device to the headset or other device, based on the user's selected charging criterion for balancing stored charges in the mobile device's own battery and in the headset's or other device's rechargeable battery, in accordance with at least one embodiment of the present invention.

FIG. 2B discloses an example network and functional block diagram of another example embodiment of the first device, the wireless mobile device communicating the second device, the wireless headset or other device of FIG. 2A, by means of near field communication circuits transferring wireless power from the mobile device to the headset or other device, in accordance with at least one embodiment of the present invention.

FIG. 2C discloses an example network and functional block diagram of another example embodiment of the first device, the wireless mobile device, transmitting power over a wire or cable connection to the second device, the wireless headset or other device, of FIG. 2A, in accordance with at least one embodiment of the present invention.

FIG. 3 discloses an example flow diagram of the operation of the first device, the wireless mobile device with a rechargeable battery of FIG. 2D, determining from a profile of power consumption, the charge consumption of the first and second devices for the selected use case, determining which device needs charging, computing the amount of charging required based on user's selected use case and selected charging criterion for balancing charges in first and second devices' battery, and transmitting power from its battery to the second device if the second device's battery requires charging or receiving power from the battery of the second device if the first device's battery requires charging, in accordance with at least one embodiment of the present invention.

FIG. 5A discloses an example flow diagram of the operation of the first device, the wireless mobile device with a rechargeable battery of FIG. 2D, in accordance with at least one embodiment of the present invention.

FIG. 5D is an example flow diagram of operational steps in the second device, the wireless headset or other device of FIGS. 2A-2D, according to an example embodiment of the invention.

FIG. 8A illustrates an example embodiment of the invention, wherein a portable laptop computer wirelessly charges the rechargeable battery in the mobile device 10, in accordance with at least one embodiment of the present invention.

FIG. 8B illustrates an example embodiment of the invention, wherein the rechargeable battery in the mobile device 10 wirelessly charges a mobile phone using a profile of power consumption for the mobile phone, in accordance with at least one embodiment of the present invention.

FIG. 8C illustrates an example embodiment of the invention, wherein the rechargeable battery in the mobile device 10 wirelessly charges a tablet or smart phone using a profile of power consumption for the tablet or smart phone, in accordance with at least one embodiment of the present invention.

DISCUSSION OF EXAMPLE EMBODIMENTS OF THE INVENTION

Figure 1B:
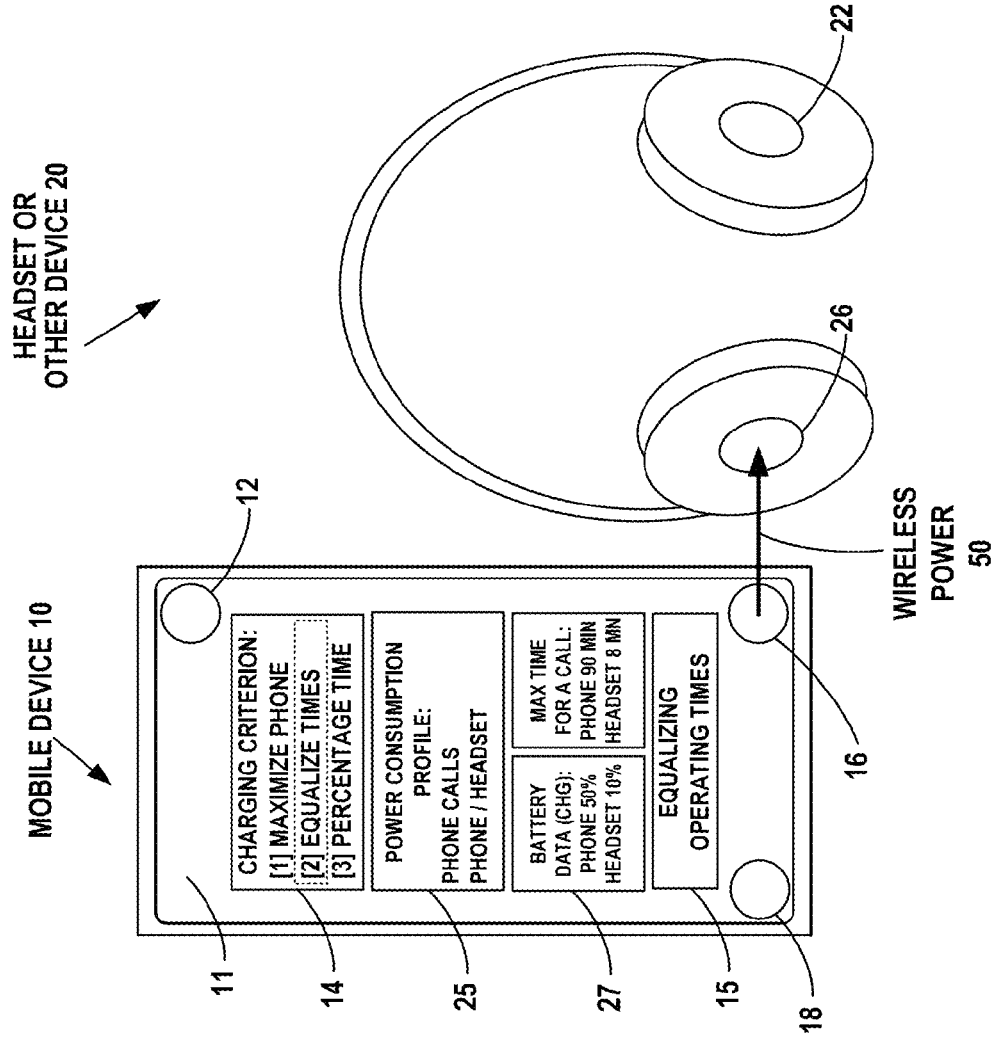
FIG. 1B discloses the example view of FIG. 1A at a later stage while charging, wherein the user has placed the wireless power transmitting coil of the mobile device close to the wireless power receiving coil of the headset or other device close to transfer wireless power to the headset or other device, the mobile device transferring an amount of charging required, based on the user's selected charging criterion for balancing stored charges in the mobile device's own battery and in the headset's or other device's rechargeable battery, in accordance with at least one embodiment of the present invention.

This section is organized into the following topics:
A. Wireless Short-Range Communication Networks
B. Bluetooth™ Communication Technology
C. Near-Field Communication (NFC) Technology
D. Wireless Charging Technology
E. Optimized Device To Device Charging A. Wireless Short-Range Communication Networks Short-range communication technologies provide communication solutions appropriate for many data applications, without the cost, traffic and legislative concerns of longer-range communication technologies. Popular short-range communication technologies include Bluetooth basic rate/enhanced data rate (BR/EDR), Bluetooth Low Energy (LE), IEEE 802.11 wireless local area network (WLAN), Wireless Universal Serial Bus (WUSB), Ultra Wide-band (UWB), Zig-Bee (IEEE 802.15.4, IEEE 802.15.4a), and near field communication technologies, such as radio frequency identification (RFID) and near field communication (NFC) technology that enable contactless identification and interconnection of wireless devices. Bluetooth Technology provides an example of wireless short-range communication establishment.

B. Bluetooth™ Communication Technology

A procedure for forming connections between Bluetooth™ devices is described in the *Bluetooth™ Specification*, Version 4, Jun. 30, 2010. Bluetooth profiles augment the Bluetooth Specification, to describe which portions of the Bluetooth protocol stack and parameter ranges are in order to perform certain use cases, such a serial data port for the exchange of data and digital voice and music between Bluetooth devices. The Bluetooth Generic Access Profile (GAP) defines the basic generic procedures for discovery of Bluetooth devices and for link management of connecting to Bluetooth devices, and is the core on which all other Bluetooth profiles are based. The Serial Port Profile (SPP) defines the requirements for Bluetooth devices in order for setting up emulated serial cable connections between two Bluetooth devices for the exchange of data and digital voice and music. The Bluetooth Headset Profile depends upon the Serial Port Profile and defines the requirements for Bluetooth devices in order to support use cases such as a wireless headset, wireless keyboard, wireless mouse, wireless speaker, and the like.

The Bluetooth™ Baseband is the part of the Bluetooth™ system that implements the Media Access Control (MAC) and physical layer procedures to support the connection formation, exchange of data information streams, and ad hoc networking between Bluetooth™ devices. Connection formation includes inquiry, inquiry scanning, inquiry response, paging, page scanning, and page response procedures.

1. Inquiry

Inquiry is a procedure where a Bluetooth™ device transmits inquiry messages and listens for responses in order to discover the other Bluetooth™ devices that are within the coverage area. Bluetooth™ devices use the inquiry procedure to discover nearby devices, or to be discovered by devices in their locality. A Bluetooth™ device that tries to find other nearby devices is known as an inquiring device and actively sends inquiry requests. Bluetooth™ devices that are available to be found are known as discoverable devices, listen or scan for these inquiry requests, and send responses. The inquiry procedure uses dedicated physical channels for the inquiry requests and responses. The inquiry procedure does not make use of any of the architectural layers above the physical channel, although a transient physical link may be considered to be present during the exchange of inquiry and inquiry response information.

Bluetooth™ devices communicate with one another over a total bandwidth of 80 MHz divided into 79 physical channels of 1 MHz each. An inquiring device wanting to discover other devices repetitively probes a first set of 16 frequencies, probing two frequencies every 625 microseconds. It repeats this at least 256 times. Then, it repetitively probes a second set of 16 frequencies. The inquiring device will repeat entire cycle at least two times. Of the 79 radio carriers, 32 are considered wake-up carriers and the inquiring device broadcasts inquiry packets on these 32 carrier frequencies.

Inquiry scan is a procedure where a Bluetooth™ device listens for inquiry messages received on its inquiry scan physical channel. A device using one of its inquiry scan channels remains passive on that channel until it receives an inquiry message on this channel from another Bluetooth™ device. This is identified by the appropriate inquiry access code. The inquiry scanning device will then follow the inquiry response procedure to return a response to the inquiring device. The inquiry scan substate is very similar to the page scan substate. However, instead of scanning for the device's device access code, the receiver may scan for the inquiry access code long enough to completely scan for 16 inquiry frequencies. The inquiry procedure uses 32 dedicated inquiry hop frequencies according to the inquiry hopping sequence. These frequencies are determined by the general inquiry address. The phase is determined by the native clock of the device carrying out the inquiry scan. Instead of, or in addition to, the general inquiry access code, the device may scan for one or more dedicated inquiry access codes. However, the scanning may follow the inquiry scan hopping sequence determined by the general inquiry address. The inquiry scan interval may be less than or equal to 2.56 s.

2. Inquiry Response

An inquiry response packet (FHS) is transmitted from the slave to the master after the slave has received an inquiry message. This packet contains information necessary for the inquiring master to page the slave and follows 625 microseconds after the receipt of the inquiry message. The inquiry response packet is received by the master at the hop frequency when the inquiry message received by the slave was first in the master-to-slave slot. The slave response substate for inquiries differs completely from the slave response substate applied for pages. When the inquiry message is received in the inquiry scan substate, the recipient may return an inquiry response (FHS) packet containing the recipient's device address (BD_ADDR) and other parameters. If the recipient has non-zero extended inquiry response data to send, it may return an extended inquiry response packet after the FHS packet. On the first inquiry message received in the inquiry scan substate the slave may enter the inquiry response substate. If the slave has non-zero extended inquiry response data to send it may return an FHS packet, with the extended inquiry response bit set to one, to the master 625 microseconds after the inquiry message was received. It may then return an extended inquiry response packet 1250 microseconds after the start of the FHS packet. If the slave's extended inquiry response data is all zeroes the slave may only return an FHS packet with the extended inquiry response bit set to zero.

A contention problem could arise when several devices are in close proximity to the inquiring device or master and all respond to an inquiry message at the same time. However, because every device has a free running clock it is highly unlikely that they all use the same phase of the inquiry hopping sequence. In order to avoid repeated collisions between devices that wake up in the same inquiry hop channel simultaneously, a device will back-off for a random period of time.

The messaging during the inquiry routines is summarized as follows:

In step 1, the master transmits an inquiry message using the inquiry access code and its own clock.

In step 2, the slave responds with the FHS packet containing the slave's Bluetooth™ device address, native clock and other slave information. This FHS packet is returned at times that tend to be random. The FHS packet is not acknowledged in the inquiry routine, but it is retransmitted at other times and frequencies as long as the master is probing with inquiry messages.

In step 3, if the slave has non-zero extended inquiry response data, it sends an extended inquiry response packet to the master.

3. Extended Inquiry Response

An Extended Inquiry Response may be used to provide miscellaneous information during the inquiry response procedure. Data types are defined for such things as local name and supported services, information that otherwise would have to be obtained by establishing a connection. A device that receives a local name and a list of supported services in an extended inquiry response does not have to connect to do a remote name request and a service discovery protocol (SDP) service search, thereby shortening the time to useful information. If the slave transmits an extended inquiry response packet, it is transmitted 1250 microseconds after the start of the inquiry response packet. The extended inquiry response packet is received by the master at the hop frequency when the inquiry message received by the slave was first in the master-to-slave slot.

4. Pane

Page is the initial phase of the connection procedure where a device transmits a train of page messages until a response is received from the target device or a timeout occurs. Page scan is a procedure where a device listens for page messages received on its page scan physical channel. In forming a connection, the paging device will become the master and the page scan device will become the slave in a piconet. Initially, after the slave has received an inquiry message, an inquiry response packet is transmitted from the slave to the master. The inquiry response packet sent from the slave contains information necessary for the inquiring master to page the slave, such as Bluetooth™ device address and the clock of the slave device. In the paging procedure, the Bluetooth™ device that will become the master carries out a page procedure by transmitting page messages in connection request packets to the specified Bluetooth™ slave device that carries out a page scanning procedure to listen for connection request packets from the paging device. A connectable Bluetooth™ device listens for a page request on its page scan channel and, once received, enters into a sequence of exchanges with the paging device. In order for a device to connect to another device, it performs frequency hopping all page scan channel frequencies, sending a page request on each frequency and listening for a response. The page scan channel uses an access code derived from the scanning device's Bluetooth™ device address BD_ADDR to identify communications on the channel. The page scan channel uses a slower hopping rate than the hop rate of the paging device, using the Bluetooth™ device clock of the scanning device as an input. A device listening on its page scan channel remains passive until it receives a page request from another Bluetooth™ device, identified by the page scan channel access code. The two devices will then follow the page procedure to form a connection where the paging device is the master and the page scan device is the slave in a piconet. In order for a paging device to connect to another Bluetooth™ device, it uses the page scan channel of the target device in order to send page requests. If the paging device does not know the phase of the target device's page scan channel, it does not know the current hop frequency of the target device. Therefore, the paging device transmits page requests on each of the page scan hop frequencies and listens for a page response. This is done at a faster hop rate, allowing the paging device to cover all page scan frequencies in a short period of time. The paging device may have some knowledge of the target device's Bluetooth™ clock, such as indicated during a previous inquiry transaction between the two devices, and may be able to predict the phase of the target device's page scan channel. It may use this information to optimize the synchronization of the paging and page scanning process and speed up the formation of the connection.

5. Service Discovery Protocol (SDP)

Bluetooth devices are designed to find other Bluetooth devices within their ten meter radio communications range and to discover what services they offer, using a service discovery protocol (SDP). The SDP searching function relies on links being established between the requesting Bluetooth device in a client role and the responding Bluetooth device in a server role. Once a link has been established, it can be used to find out about services in the responding Bluetooth device and how to connect to them.

Service Discovery Protocol (SDP) is used to allow devices to discover what services each other support, and what parameters to use to connect to them. For example, when connecting a mobile phone to a Bluetooth headset, SDP will be used to determine which Bluetooth profiles are supported by the headset (headset profile, hands free profile, advanced audio distribution profile, etc.) and the protocol multiplexor settings needed to connect to each of them. Each service is identified by a Universally Unique Identifier (UUID), with official services (Bluetooth profiles) assigned a short form UUID (16 bits rather than the full 128).

C. Near-Field Communication (NFC) Technology

Near-field communication (NFC) technology communicates between two NFC Devices or between an NFC Device and an NFC Tag via magnetic field induction, where two loop antennas are located within each other's near field, effectively energizing a wireless contact by forming an air-core transformer. An example NFC radio operates within the unlicensed radio frequency ISM band of 13.56 MHz, with a bandwidth of approximately 2 MHz over a typical distance of a few centimeters. The user may bring the two NFC devices close to one another to allow near field communication between the devices. Communication between two NFC devices occurs when they are brought within close proximity of each other: A simple wave or touch can establish an NFC connection that may be used to exchange specific information for another communications protocol, which may then be used to create an actual connection in the other communications protocol.

NFC technology is an extension of the ISO/IEC 14443 proximity-card standard for contactless smartcards and radio frequency ID (RFID) devices, which combines the interface of a contactless smartcard and a reader into a single device, and uses the ISO/IEC 18092 NFC communication standard to enable two-way communication. An NFC radio may communicate with both existing ISO/IEC 14443 contactless smartcards and readers, as well as with other NFC devices by using ISO/IEC 18092. The NFC Forum™, a non-profit industry association, has released specifications that enable different operation modes called: tag emulation, read/write mode, and peer to peer communication. Furthermore, NFC Forum has defined specifications for NFC Data Exchange Format (NDEF), NFC Tag Types, NFC Record Type Definition, and Connection Handover Specification. The ISO/IEC 18092 standard defines communication modes for Near Field Communication Interface and Protocol (NFCIP-1) using inductively coupled devices operating at the center frequency of 13.56 MHz for interconnection of computer peripherals. The ISO/IEC 18092 standard specifies modulation schemes, codings, transfer speeds and frame format of the RF interface, initialization schemes, conditions required for data collision control during initialization, and a transport protocol including protocol activation and data exchange methods.

In alternate example embodiments of the invention, RFID transponders may be used in devices, which may be the passive type or the active type, instead of the NFC transponders. A passive RFID transponder requires no internal power source to communicate with an RFID reader, and is only active when it is near an RFID reader that energizes the transponder with a continuous radio frequency signal at a resonant frequency of the antenna. The small electrical current induced in the antenna by the continuous radio frequency signal provides enough power for an integrated circuit in the transponder to power up and transmit a modulated response, typically by backscattering the continuous carrier wave from the RFID reader. A passive RFID transponder may include writable electrically erasable, programmable, read-only memory (EEPROM) for storing data received from the RFID reader, which modulates the continuous carrier wave sent by the RFID reader. Reading distances for passive RFID transponders typically range from a few centimeters to a few meters, depending on the radio frequency and antenna design. By contrast, active RFID transponders require a power source to receive and transmit information with an RFID reader. The RFID transponder may be affixed to or integrated with the wireless device A and device B and the user brings the RFID transponder on the device A close to an RFID reader circuit in device B to allow near field communication between the devices. In example embodiments, both devices A and B may have RFID reader circuits to read RFID signals from the other device.

In an example embodiment, the wireless transceiver carrier in devices may be a suitable short-range communications protocol, such as Radio Frequency Identification (RFID), Near Field Communication (NFC), Infrared Data Association (IrDA), or Ultra Wide Band (UWB), for example.

An example of the Radio Frequency Identification (RFID) short-range carrier is described, for example, ISO 11785 (air interface protocol), ISO 14443 (air interface protocol), and ISO 15693.

An example of the Near Field Communication (NFC) short-range carrier is described, for example, in ISO/IEC 14443 and ISO/IEC 18092.

An example of the Infrared Data Association (IrDA) short-range carrier is described, for example, in *IrDA Link Access Protocol*, v1.1 (1996).

An example of the Ultra Wide Band (UWB) short-range carrier is described, for example, in *WiMedia Common Radio Platform Specification*, Version 1.5 (2010).

D. Wireless Charging Technology

Rechargeable batteries in cellular phones and other portable communication devices, such as NiCd, nickel-metal hydride (NiMH), Lithium-ion, and Lithium-Polymer batteries and Super Capacitors, can be recharged with household alternating current (AC) power coupled through a voltage reduction transformer, an alternating-to-direct current converter, and appropriate battery monitoring and charging circuits. They can also be recharged with a 12-volt cigarette lighter socket provided in an automobile coupled through a DC voltage reduction circuit and appropriate battery monitoring and charging circuits. However, in both cases, the portable communication device must be plugged into the household AC power source or into the automobile power source, limiting the mobility of the communication device.

Recently, wireless charging has become available for rechargeable batteries in cellular phones and other portable communication devices, using contact-less electromagnetic induction. A power source circuit in a wireless charging device drives a resonant frequency circuit that produces a source alternating current in a frequency range for example between 50 kHz and 20 MHz, which is driven through a transmitting coil in the charging device. The alternating magnetic field produced by the transmitting coil inductively couples with a corresponding receiving coil in the cellular phone or other portable communication device, thereby producing a corresponding induced alternating current that drives a circuit at its resonant frequency in the range for example between 50 kHz and 20 MHz to produce an output AC voltage. A conversion circuit in the cellular phone or other portable communication device, uses a transformer to adjust the output AC voltage, an alternating-to-direct current converter, and appropriate battery monitoring and charging circuits to produce an appropriate DC charging voltage for the rechargeable battery.

Large sized wireless charging pads have become available to charge rechargeable batteries in multiple portable communication devices, high powered hand tools, domestic appliances, or garden tools using contact-less electromagnetic induction. Wireless charging pads are generally shaped as a flat plate and typically have an active charging surface approximately the size of a sheet of typing paper. Other shapes for the charging pad may not be flat, but instead shaped to conform to particularly shaped user devices to be charged, for example a charger shaped as a wall-mounted holder for a garden tool. Wireless charging pads use multiple transmitting coils or a single large transmitting coil to distribute their magnetic flux over the active charging surface. The mobile device (charged device) may provide control for the charger, particularly indicating desirable power levels and when to stop charging.

There are at least three methods of wireless charging: [1] inductive charging, [2] radio charging, and [3] resonance charging.

Inductive charging may be used for charging mid-sized items such as cell phones, MP3 players and PDAs. In inductive charging, the energy may be transferred from a primary coil to a secondary coil by electromagnetic induction. When a device requires a charge, it is placed on the charging pad, which may be plugged into a socket.

In radio charging, a transmitter, plugged into a socket, generates radio waves. When the receiver, attached to the device to be charged, is set to the same frequency as the transmitter, the transmitter will charge the device's battery.

In resonance charging, a copper coil attached to a power source comprises the sending unit. Another coil, attached to the device to be charged, is the receiver. Both coils are tuned to the same electromagnetic frequency, which makes it possible for energy to be transferred from the sending unit to the device to be charged. The resonance enables charging over a longer distance compared to regular inductive charging.

At least three typical coil alignment strategies are [1] guided positioning with tactile or optical feedback (e.g. a magnet or positioning markers), [2] free positioning using a moving coil, and [3] free positioning using coil array.

At least three techniques may be used by the charger, separately or together, to initially react to a new potentially chargeable device. These are [1] capacitance change (to detect a device), [2] resonance change (to detect device presence and location), and [3] digital ping (to get the desired power levels). The digital ping is also used to detect when the charged device has left the charging area.

In an example embodiment of the invention, the power management of wireless powering is arranged as part of Near Field Communication (NFC) operation. A special wireless powering mode is used to keep high power transfer efficiency on during the whole data transfer session of the wireless memory operation. Power transfer of 20-50 mW power class can be done using standard NFC transceivers and typical NFC antennas up to 30 mm distances. The higher power classes of 50-100 mW and 100-150 mW requires special circuits and are arranged as follows:

1. NFC antenna are extended with additional switchable antenna elements and/or other components that the same antenna system can operate in at least two modes/states (low-Q for communication purposes and high-Q for power transfer purposes).

2. The standard NFC transmit (Tx)/receive (Rx) circuitry is disconnected in mobile device and other device after negotiations with standard NFC communication, and the system is set to the high-Q state to increase Q>100 at mobile device and other device, and up to 150 mW power is available in the other device (during the charging period or wireless memory communication period). At the end of the wireless memory session, the antenna system returns to low-Q state returning Q of the antennas to ~30 and NFC communication could be used to end the session.

3. NFC antennas extended with additional components to improve power transmission efficiency so that >75% of the 200 mW available in standard NFC transmitter antenna is transferred into the other device (during the charging period or wireless memory communication period).

E. Optimized Device to Device Charging

In an example embodiment of the invention, the user of a first device may select a charging criterion for balancing stored charges in the first device's own battery with those in a second device's rechargeable battery. When the first device determines that recharging of the second device's rechargeable battery is required, it computes an amount of charging in order to satisfy the user's selected charging criterion. The first device then transmits power provided by it's own battery, to the second device. The power is continued until the present level of stored battery charge in the second device's rechargeable battery reaches the computed amount of charging required.

In an example embodiment of the invention, both the first device and the second device have rechargeable batteries. The first device determines from a profile of power consumption, the charge consumption of both the first and second devices for the user's selected use case, for example, phone calls, web browsing, music listening, videos, or games. The first device determines which device needs charging. The first device computes the amount of charging required based on user's selected use case and the user's selected charging criterion for balancing charges in first and second devices' batteries, for example equalizing operational times. The first device then either transmits power from its battery to the second device if the second device's battery requires charging or alternately, the first device receives power from the battery of the second device if the first device's battery requires charging.

In an example embodiment of the invention, an optimized device to device charging and power management system enables two devices to wirelessly connect and share energy. In accordance with an example embodiment of the invention, a database may be searched for descriptions of the devices to obtain battery charging characteristics. The stored battery charge may be wirelessly adjusted for the two devices so that the user-selected charging criterion may be met. For example, the stored battery charge may be wirelessly adjusted for two devices so that their operation times are approximately the same. Example use cases include wirelessly charging from a mobile phone to a headset or from one phone to another phone. In accordance with an example embodiment of the invention, the wireless charging may be applied to a rechargeable battery power pack of a device. In accordance with an example embodiment of the invention, charging kiosks may provide wireless charging services for rechargeable batteries carried by travelers in their mobile phones and other battery-powered devices.

FIG. 1A discloses an example view prior to charging, illustrating an example embodiment of wireless mobile device 10 communicating with an example embodiment of wireless headset or other device 20 having a rechargeable battery. Wireless packets 30, for example Bluetooth data packets, containing digital audio, music, or data, may be transmitted from the antenna 12 of the mobile device 10 to the antenna 22 of the wireless headset or other device 20. The mobile device 10 is programmed to provide its user with charging criterion options 14 displayed on the touch screen display 11 for balancing stored charges in its own battery and in the headset's or other device's rechargeable battery. Three example charging criterion options are displayed: "[1] Maximize Phone", "[2] Equalize Times", and "[3] Percentage Time". The mobile device 10 has received the user's selection of a charging criterion, "[2] Equalizing Times", on the touch screen display 11 of the mobile device 10, for balancing stored charges in the wireless device's 10 own battery and in the wireless headset's or other device's 20 rechargeable battery. The mobile device 10 may also receive the user's selection of a use case, for example, phone calls, web browsing, music listening, videos, or games. The mobile device 10 has received the user's selection of a use case "Phone Calls". The mobile device 10 may access a database, to retrieve a profile of power consumption for the use case "Phone Calls", the profile indicating the charge consumption of both a phone and a headset, as shown at 25 on the touch screen display 11 of the mobile device 10. The profile may indicate the power consumption of several types of devices, based on the use case, for example, the consumption of a smart phone for phone calls may be 1 W, for web browsing may be 0.5 W, and for games may be 2 W. Web browsing and games are highly dynamic and depending on the content whereas phone calls are more predictable. The mobile device 10 also accesses a database, to retrieve battery characteristic data for the headset's or other device's 20 rechargeable battery.

The mobile device 10 transmits via its Bluetooth antenna 12 to the Bluetooth antenna 22 of the wireless headset or other device 20, a request for stored battery charge data describing a current state of the rechargeable battery in the wireless headset or other device 20, for example in a Bluetooth data packet. The wireless headset or other device 20 measures the current state of the rechargeable battery in the headset or other device 20. The wireless headset or other device 20 then transmits via its Bluetooth antenna 22 to the mobile device 10, a Bluetooth data packet 40 containing stored battery charge data describing the current state of the wireless headset's or other device's 20 rechargeable battery. The figure further shows the mobile device 10 receiving at the antenna 12, stored battery charge data in wireless packets 40, for example Bluetooth data packets, characterizing the current state of the rechargeable battery in the headset or other device 20. The mobile device 10 may display stored battery charge data for both the mobile device 10 and the headset or other device 20, as shown at 27 on the touch screen display 11 of the mobile device 10.

The mobile device 10 compares the stored battery charge data received from the wireless headset or other device 20, with a recharging threshold. The mobile device 10 determines that recharging of the wireless headset's or other device's 20 rechargeable battery is required, based on the comparison. For example, if the charging criterion is to equalize operational times, then if the mobile device 10 determines that the operational time of the mobile device 10 is greater than the operational time of the headset or other device 20 by a threshold amount, then the rechargeable battery in the headset or other device 20 needs recharging. The mobile device 10 may display the computed maximum operational time for a phone call for both the mobile device 10 and the headset or other device 20, as shown at 29 on the touch screen display 11 of the mobile device 10. In an alternate embodiment of the invention shown in FIGS. 2D and 3, both of the devices have rechargeable batteries and whichever device has a lower operational time will have its battery charged by the other device.

FIG. 1A further shows the mobile device 10 displaying a notice 15 on the touch screen display 11 to its user that the rechargeable battery in the headset or other device 20 needs recharging, in accordance with at least one embodiment of the present invention. Also shown in the figure is a wireless power transmission antenna 16 and a near field communication (NFC) antenna 18 of the mobile device 10, and a wireless power receiving antenna 26 of the headset or other device 20.

The retrieved battery characteristic data for the headset's or other device's 20 rechargeable battery, may include battery maximum capacity and recharging threshold data, for the headset's or other device's 20 rechargeable battery. The recharging threshold may include an accessed battery maximum capacity and an accessed recharging threshold data for the headset's or other device's 20 rechargeable battery.

FIG. 1B discloses the example view of FIG. 1A at a later stage while charging, wherein the user has placed the wireless power transmitting antenna 16 of the mobile device 10 close to the wireless power receiving antenna 26 of the headset or other device 20, to transfer wireless power 50 to the headset or other device 20. The mobile device 10 computes an amount of charging required for the headset's or other device's 20 rechargeable battery, in order to satisfy the user's selected charging criterion, "[2] Equalizing Times", for balancing stored charges in its own battery and in the headset's or other device's 20 rechargeable battery. The mobile device 10 transmits wireless power 50 provided by the wireless device's 10 own battery, from the power transmission antenna 16 to the wireless power receiving antenna 26 of the headset or other device 20, for charging the headset's or other device's 20 rechargeable battery. The figure further shows the mobile device 10 displaying a notice 15 "Equalizing Operating Times" on the touch screen display 11 to its user that the rechargeable battery is being recharged.

The mobile device 10 accesses a database to retrieve battery characteristics data for battery of second device and profiles of different power consumption for different use cases. The mobile device 10 determines from the profile of power consumption, [1] charge consumption of the mobile device 10 for selected use case (eg., for phone calls, a smart phone may consume 1 Watt) and [2] the charge consumption of the headset or other device 20 for the selected use case (e.g., for phone calls, a headset may consume 0.1 watt). The mobile device 10 computes operating time for both the first device and the second device (stored battery charge/charge consumption) for the selected use case. The mobile device 10 determines whether the operating time in both the mobile device 10 and headset or other device 20 is sufficient to satisfy the user's selected charging criterion for the selected use case. The mobile device 10 determines which device needs charging and computes amount of charging required based on user's selected use case (e.g., phone call) and selected charging criterion for balancing charges in first and second devices' battery (e.g., equalize times). The mobile device 10 transmits power from its battery to the headset or other device 20 if the headset or other device 20 battery requires charging. In an alternate embodiment of the invention shown in FIGS. 2D and 3, both of the devices have rechargeable batteries and whichever device has a lower operational time will have its battery charged by the other device. If the mobile device 10 has a lower operational time, it receives power from the battery of the headset or other device 20 if the mobile device 10 battery requires charging.

The headset or other device 20 repeatedly measures the present level of stored battery charge in the headset's or other device's 20 rechargeable battery and transmits NFC data packets to the NFC antenna 18 of the mobile device 10, containing information related to the present level of stored battery charge of the headset's or other device's 20 rechargeable battery, until the wireless power 50 terminates when the present level of stored battery charge in the headset's or other device's 20 rechargeable battery satisfies the battery charging criterion, "[2] Equalizing Times". The mobile device 10 monitors via the NFC antenna 18, the present level of stored battery charge in the headset's or other device's 20 rechargeable battery and a present level of stored battery charge in the wireless device's 10 own battery. Other protocols, such as ultra-wideband or Bluetooth Low Energy, may be used instead of NFC, to send data between the devices. The mobile device 10 terminates the transmitting of wireless power 50 to the headset or other device 20, when the present level of stored battery charge in the headset's or other device's 20 rechargeable battery reaches the computed amount of charging required for the headset's or other device's 20 rechargeable battery.

FIG. 2A discloses an example network and functional block diagram of the example wireless mobile device 10 communicating with the example wireless headset or other device 20 of FIG. 1B. The wireless mobile device 10 may be a communications device, such as a cell phone, portable radio, portable TV, PDA, laptop computer, palmtop computer, or the like, capable of communicating in a personal area network (PAN) via the Bluetooth circuit 12, local area network (LAN) via the IEEE 802.11 MAC & PHY circuit 112, or wide area network (WAN) via the wide area wireless circuit 114. The figure shows the transfer of wireless power 50 from the power transmitting circuit 100 of the mobile device 10 to the power receiving circuit 150 of the headset or other device 20, based on the user's selected charging criterion for balancing stored charges in the mobile device's 10 own battery 102 and in the headset's or other device's 20 rechargeable battery 160, in accordance with at least one embodiment of the present invention. The battery 160 in the headset or other device 20 normally powers the audio and data circuits 156 for normal operations. The battery 160 may comprise several batteries or cells. Removable storage media 118 may be included, to store data and/or computer program code as an example computer program product.

Wireless packets 30, for example Bluetooth data packets, containing digital audio, music, or data, may be transmitted from the antenna of Bluetooth circuit 12 of the mobile device 10 to the antenna of Bluetooth circuit 22 of the wireless headset or other device 20. The mobile device 10 is programmed in the RAM and/or ROM of processor 110 to provide its user with charging criterion options 14 displayed on the touch screen display 11 for balancing stored charges in its own battery 102 and in the headset's or other device's rechargeable battery 160. Three example charging criterion options are displayed: "[1] Maximize Phone", "[2] Equalize Times", and "[3] Percentage Time". The mobile device 10 receives the user's selection of a charging criterion, "[2] Equalizing Times", on the touch screen display 11 of the mobile device 10, for balancing stored charges in the wireless device's 10 own battery 102 and in the wireless headset's or other device's 20 rechargeable battery 160.

The mobile device 10 transmits via its Bluetooth circuit 12 to the Bluetooth circuit 22 of the wireless headset or other device 20, a request for stored battery charge data describing a current state of the rechargeable battery 160 in the wireless headset or other device 20, for example in a Bluetooth data packet. The wireless headset or other device 20 measures the current state of the rechargeable battery in the headset or other device 20, with the current "I" measurement module 170 and the voltage "V" measurement module 180. The wireless headset or other device 20 then transmits via its Bluetooth circuit 22 to the Bluetooth circuit 12 of the mobile device 10, a Bluetooth data packet 40 containing stored battery charge data describing the current state of the wireless headset's or other device's 20 rechargeable battery 160.

The mobile device 10 accesses the database 24, to retrieve battery characteristic data for the headset's or other device's 20 rechargeable battery 160. The processor 110 in the mobile device 10 compares the stored battery charge data received from the wireless headset or other device 20, with a recharging threshold. The mobile device 10 determines that recharging of the wireless headset's or other device's 20 rechargeable battery 160 is required, based on the comparison. The mobile device 10 may include in the database 24, a profile 25 of power consumption for the use case "Phone Calls", the profile indicating the charge consumption of both a phone and a headset, as shown at 25 on the touch screen display 11 of the mobile device 10. The profile may indicate the power consumption of several types of devices, based on the use case, for example, the consumption of a smart phone for phone calls may be 1 W, for web browsing may be 0.5 W, and for games may be 2 W. Web browsing and games are highly dynamic and depending on the content whereas phone calls are more predictable. The mobile device 10 also accesses a database, to retrieve battery characteristic data for the headset's or other device's 20 rechargeable battery.

The processor 110 of the mobile device 10 computes an amount of charging required for the headset's or other device's 20 rechargeable battery 160, in order to satisfy the user's selected charging criterion, "[2] Equalizing Times", for balancing stored charges in its own battery 102 and in the headset's or other device's 20 rechargeable battery 160.

The mobile device 10 displays a notice 15 on the touch screen display 11 to its user that the rechargeable battery 160 in the headset or other device 20 needs recharging. The user then places the wireless power transmitting antenna 16 of the mobile device 10 close to the wireless power receiving antenna 26 of the headset or other device 20, to transfer wireless power 50 to the headset or other device 20. The mobile device 10 and the headset or other device 20 include respective NFC data circuits 116 and 166 that generate a triggering signal when the respective NFC data circuits are brought within an NFC touch proximity, the triggering signal causing the wireless powering 50 to commence, in accordance with example embodiments of the invention. The mobile device 10 transmits wireless power 50 provided by the wireless device's 10 own battery, from the power transmission antenna 16 to the wireless power receiving antenna 26 of the headset or other device 20, for charging the headset's or other device's 20 rechargeable battery.

In an example embodiment of the invention, other techniques may be used by the mobile device 10 to sense the close proximity of the headset or other device 20 to begin wireless charging. For example, a capacitance change may be detected, a resonance change in the wireless power transmission circuit 100, or a digital ping in the Bluetooth circuits 12 and 22. The digital ping may also be used to detect when the headset or other device 20 has left the charging area.

The power transmitting circuit 100 of the mobile device 10 and the power receiving circuit 150 of the headset or other device 20 uses contact-less electromagnetic induction to transfer the wireless power 50. The battery 102 in the power transmitting circuit 100 drives a resonant frequency circuit in the power frequency driver/interface 106 through a power control module 104, which produces a source alternating current in a frequency range for example between 50 kHz and 20 MHz, which is driven through the transmitting coil of the power transmitting antenna 16. The alternating magnetic field produced by the transmitting coil of the power transmitting antenna 16 inductively couples with a corresponding receiving coil in the power receiving antenna 26 of the power receiving circuit 150 of the headset or other device 20, thereby producing a corresponding induced alternating current that drives a circuit at its resonant frequency in the range for example between 50 kHz and 20 MHz to produce an output AC voltage. A conversion circuit in the rectifier and interface 152 of the power receiving circuit 150, uses a transformer to adjust the output AC voltage, an alternating-to-direct current converter, and appropriate battery monitoring and powering circuits to produce an appropriate DC powering voltage that is applied to the input of the constant current/constant voltage (CC/CV) charger integrated circuit (IC) 154.

The CC/CV charger IC 154 outputs a regulated current and voltage to charge the positive terminal of battery 160 during the recharging operations. The charging current from the CC/CV charger IC 154 passes over line 155 and through the current measurement module 170. The current measurement module 170 provides current measurement values "I" on line 172 to the processor 158 of the headset or other device 20. The voltage measurement module 180 is connected across the terminals of the battery 160 with its negative terminal connected to ground 161, and provides voltage measurement values "V" on line 182 to the processor 158 of the headset or other device 20. The processing module 158 of the headset or other device 20 is programmed to control the CC/CV charger IC 154 over line 140 to apply charging current and voltage to the battery 160, in accordance with a constant current/constant voltage charging process, as further described below.

The headset or other device 20 repeatedly measures the present level of stored battery charge in the headset's or other device's 20 rechargeable battery 160 and transmits NFC data packets 120 to the NFC antenna 18 of the mobile device 10, containing information related to the present level of stored battery charge of the headset's or other device's 20 rechargeable battery 160, until the wireless power 50 terminates when the present level of stored battery charge in the headset's or other device's 20 rechargeable battery 160 satisfies the battery charging criterion, "[2] Equalizing Times". The processor 110 in the mobile device 10 monitors via the NFC antenna 18, the present level of stored battery charge in the headset's or other device's 20 rechargeable battery 160 and a present level of stored battery charge in the wireless device's 10 own battery 102. The mobile device 10 terminates the transmitting of wireless power 50 to the headset or other device 20, when the present level of stored battery charge in the headset's or other device's 20 rechargeable battery 160 reaches the computed amount of charging required for the headset's or other device's 20 rechargeable battery 160.

FIG. 2B discloses an example network and functional block diagram of another example embodiment of the wireless mobile device 10 communicating the wireless headset or other device 20 of FIG. 2A. Near field communication (NFC) circuits 106' and 152' transfer wireless power 50 at a lower level of less than the 150 mW, from the mobile device 10 to the headset or other device 20, in accordance with at least one embodiment of the present invention. The (NFC) circuits 106' and 152' may provide a lower level of less than the 150 mW available from standard NFC circuitry, when compared with the higher wireless power levels capable of the resonant circuit 106 of FIG. 2A.

In an example embodiment of the invention, the power management of wireless powering is arranged as part of Near Field Communication (NFC) operation. A special wireless powering mode is used to keep high power transfer efficiency on during the whole data transfer session of the wireless memory operation. Power transfer of 20-50 mW power class can be done using standard NFC transceivers and typical NFC antennas up to 30 mm distances.

The standard NFC transmit (Tx)/receive (Rx) circuitry is disconnected in mobile device 10 and headset or other device 20 after negotiations with standard NFC communication, and the system is set to the high-Q state to increase Q>100 at mobile device 10 and headset or other device 20. Up to 150 mW power is available to the headset or other device 20 during the charging period. At the end of the wireless charging session, the antenna system is returned to a low-Q state, returning the Q of the antennas to ~30 to enable NFC communication to resume.

FIG. 2C discloses an example network and functional block diagram of another example embodiment of the first device, the wireless mobile device 10, transmitting power from a power transmitting circuit 100" over a wire or cable connection 50' to a power receiving circuit 150" in the second device, the wireless headset or other device 20, of FIG. 2A, in accordance with at least one embodiment of the present invention.

Figure 2D:
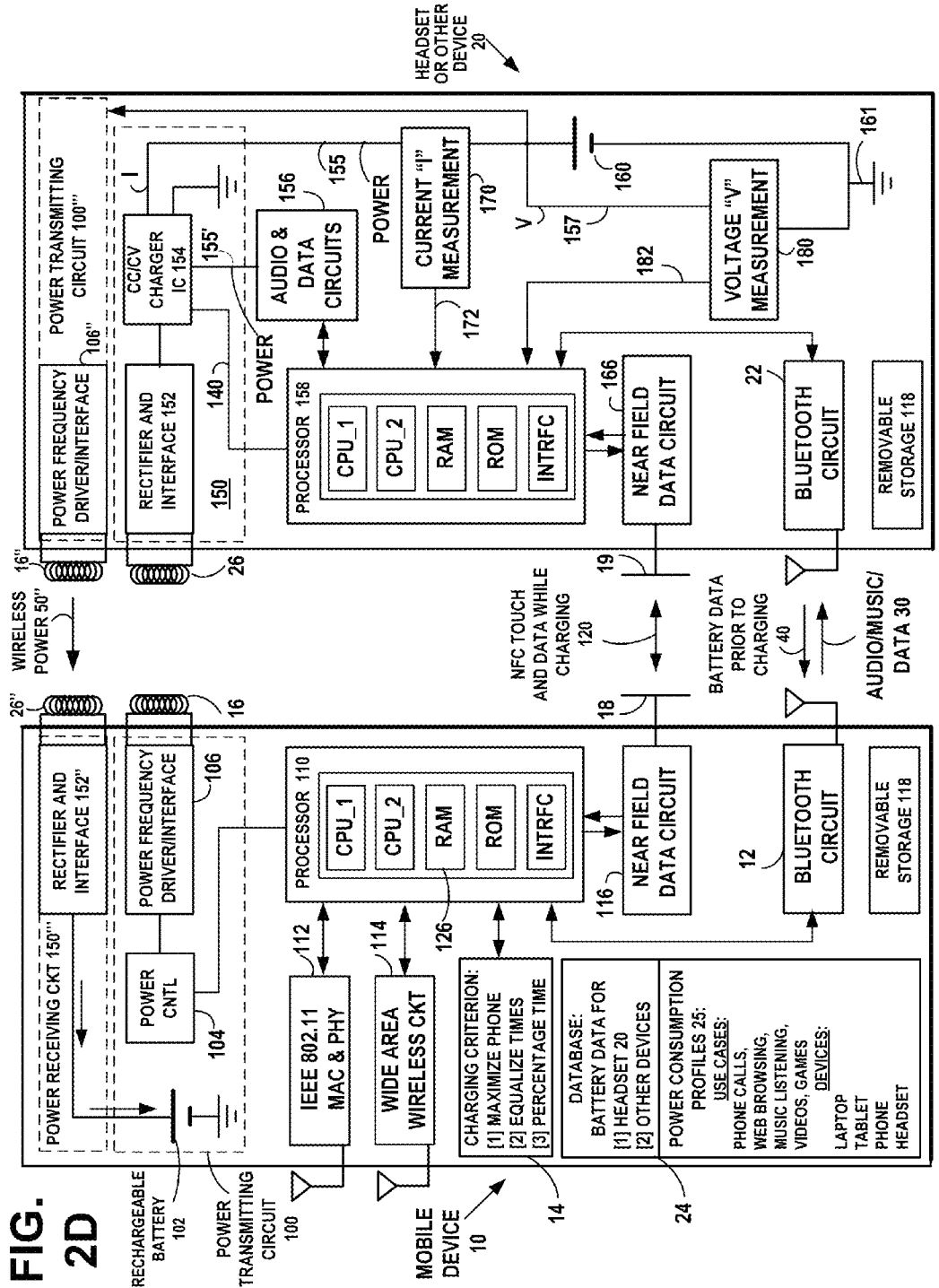
FIG. 2D discloses an example network and functional block diagram of another example embodiment of the first device, the wireless mobile device, having a rechargeable battery, receiving wireless power from the second device, the wireless headset or other device, of FIG. 2A, in accordance with at least one embodiment of the present invention.

FIG. 2D discloses an example network and functional block diagram of another example embodiment of the first device, the wireless mobile device 10, having a rechargeable battery 102 that is being charged by receiving wireless power 50" via an antenna 26" and a rectifier and interface 152" in a power receiving circuit 150''', that is transmitted from the second device, the wireless headset or other device 20, of FIG. 2A. The second device, the wireless headset or other device 20, includes an antenna 16" and power frequency driver/interface 106" in a power transmitting circuit 100''' that is transmitting the wireless power 50" to the first device 10, in accordance with at least one embodiment of the present invention.

The first device, the wireless mobile device 10, determines that recharging of its rechargeable battery 102 is required. The first device, the wireless mobile device 10, computes an amount of charging required for its rechargeable battery 102, in order to satisfy the user's selected charging criterion. The first device, the wireless mobile device 10, then communicates information specifying the required power to the second device 20 via Bluetooth circuits 12 and 22 or via NFC circuits 18 and 19. The first device, the wireless mobile device 10, then receives wireless power 50" provided by the second device's 20 rechargeable battery 160, for charging the rechargeable battery 102 until a present level of stored battery charge in the rechargeable battery 102 reaches the computed amount of charging required for the battery 102.

FIG. 3 discloses an example flow diagram 300 of the operation of the first device, the wireless mobile device 10 with a rechargeable battery 102 of FIG. 2D. The first device 10 determines from a profile of power consumption 25, the charge consumption of the first 10 and second 20 devices for the selected use case. The first device 10 determines which device 10 or 20 needs charging. The first device 10 computes the amount of charging required based on user's selected use case and selected charging criterion 14 for balancing charges in first and second devices' batteries. The first device 10 then either transmits power from its battery 102 to the second device 20 if the second device's battery 160 requires charging or alternately receives power from the battery 160 of the second device 20 if the first device's 10 battery 102 requires charging, in accordance with at least one embodiment of the present invention.

The steps of the flow diagram 300 represent computer code instructions stored in the RAM and/or ROM memory of the wireless device 10 of FIG. 2D, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 302: First device receives user's selection of use case (eg., phone calls, web browsing, listening, videos, games) and charging criterion (eg., equalize times) for balancing stored charges in own rechargeable battery and second device's rechargeable battery.

Step 304: First device monitors own stored battery charge.

Step 306: First device receives stored battery charge data from second device.

Step 308: First device accesses database to retrieve battery characteristics data for battery of second device and profiles of different power consumption for different use cases.

Step 310: First device determines from profile of power consumption, [1] charge consumption of the first device for selected use case (eg., for phone calls, a smart phone may consume 1 Watt) and [2] charge consumption of the second device for selected use case (eg., for phone calls, a headset may consume 0.1 watts).

Step 312: First device computes operating time for both the first device and the second device (stored battery charge/ charge consumption rate) for the selected use case.

Step 314: Is the operating time in both the first and second devices sufficient to satisfy the user's selected charging criterion for the selected use case?

Step 315: If YES, then go to step 304.

Step 316: First device determines which device needs charging and computes amount of charging required based on user's selected use case (eg., phone call) and selected charging criterion for balancing charges in first and second devices' battery (eg., equalize times)

Step 318: First device transmits power from its battery to the second device if the second device's battery requires charging or first device receives power from the battery of the second device if the first device's battery requires charging.

Figure 4A:
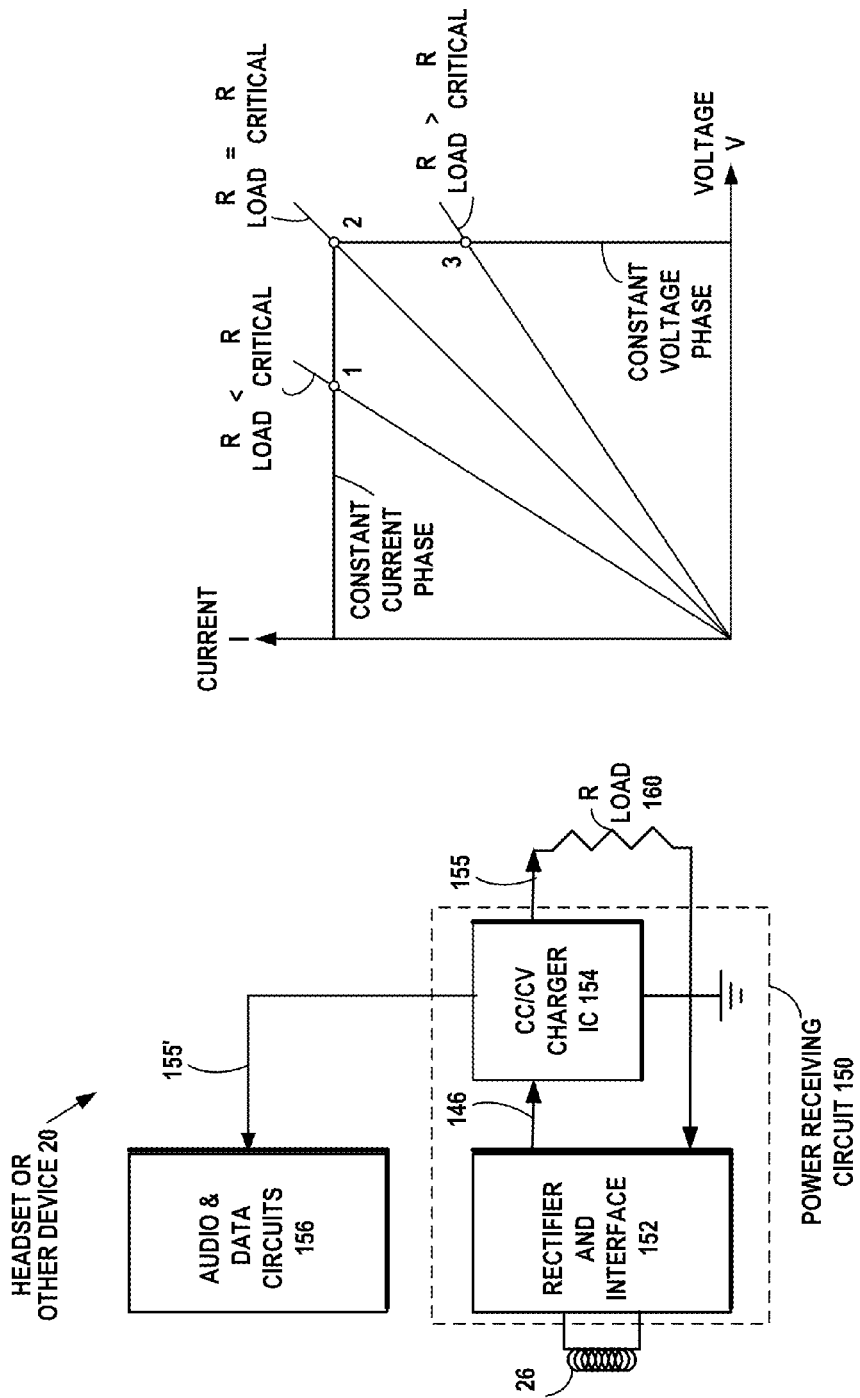
FIG. 4A illustrates the general principles of operation of the constant current/constant voltage (CC/CV) charger IC in the example second device, the wireless headset or other device of, FIGS. 2A-2D, in accordance with an embodiment of the invention.

FIG. 4A illustrates the general principles of operation of the constant current/constant voltage (CC/CV) charger IC 154 in the example second device, the wireless headset or other device 20 of FIGS. 2A-2D, in accordance with an embodiment of the invention. In order to illustrate the general principles of operation of the constant current/constant voltage (CC/CV) charger IC 154, an example "ideal" output current-voltage (I-V) characteristic of the CC/CV charger IC 154 is shown in FIG. 3, when supplying current I through a variable resistance load R(load). When R(load) is connected across the terminals of the CC/CV charger IC 154 and a constant current I flows through the load, the voltage across the load is given by Ohm's law: V=IR. As long as the voltage is below a maximum value, the current through the load will be constant. The CC/CV charger IC 154 thus operates in the constant current (CC) phase at an operating point 1. If the resistance of R(load) is increased while the constant current I is flowing through it, the voltage V=IR increases until it reaches a maximum allowable value at the operating point 2. Beyond this point, as the resistance of R(load) is increased, the voltage will be limited and the CC/CV charger IC 154 begins to operate in the constant voltage (CV) phase at an operating point 3. The resistance R(critical) is called the critical resistance at the operating point 2 and determines whether the CC/CV charger IC 154 operates in the constant current CC phase where R(load)<R(critical) or in the constant voltage CV phase where R(load)>R(critical).

The relevance of the general principles of operation illustrated in FIG. 3 to charging the rechargeable battery 160 with the CC/CV charger IC 154, is that the load represented by the battery 160 varies in a manner approximately resembling that of a variable resistance R(load), as the battery 160 accumulates charge during a charging operation by the CC/CV charger IC 154. As the accumulated charge in the battery 160 increases, there comes a point at which the operation of the CC/CV charger IC 154 passes from the constant current (CC) phase to the constant voltage (CV) phase. In accordance with an embodiment of the invention, estimating the remaining charging time of the rechargeable battery 160 is based on determining whether the battery's charging point is in the constant current phase or in the constant voltage phase.

In the constant current phase the CC/CV charger IC 154 regulates its output current to be the maximum current that is allowed for the battery 160. The actual charging current "I" may be lower than the output current of the CC/CV charger IC 154, since often the CC/CV charger IC 154 is also used to provide energy for the audio and data circuits 156.

In the constant voltage phase the CC/CV charger IC 154 regulates its output voltage to be the maximum voltage that is allowed for the battery 160. The measured battery voltage (VBAT) may be slightly lower than the output voltage of the CC/CV charger IC 154, because of impedance between the output of the CC/CV charger IC 154 and the VBAT measurement point of the measurement module 180. That may mean that the measured voltage is not really constant, but increases slightly during this phase. The battery is considered fully charged and charging is terminated when the charging current drops below a predefined limit, for example C/20 (the battery nominal capacity divided by 20).

Figure 4B:
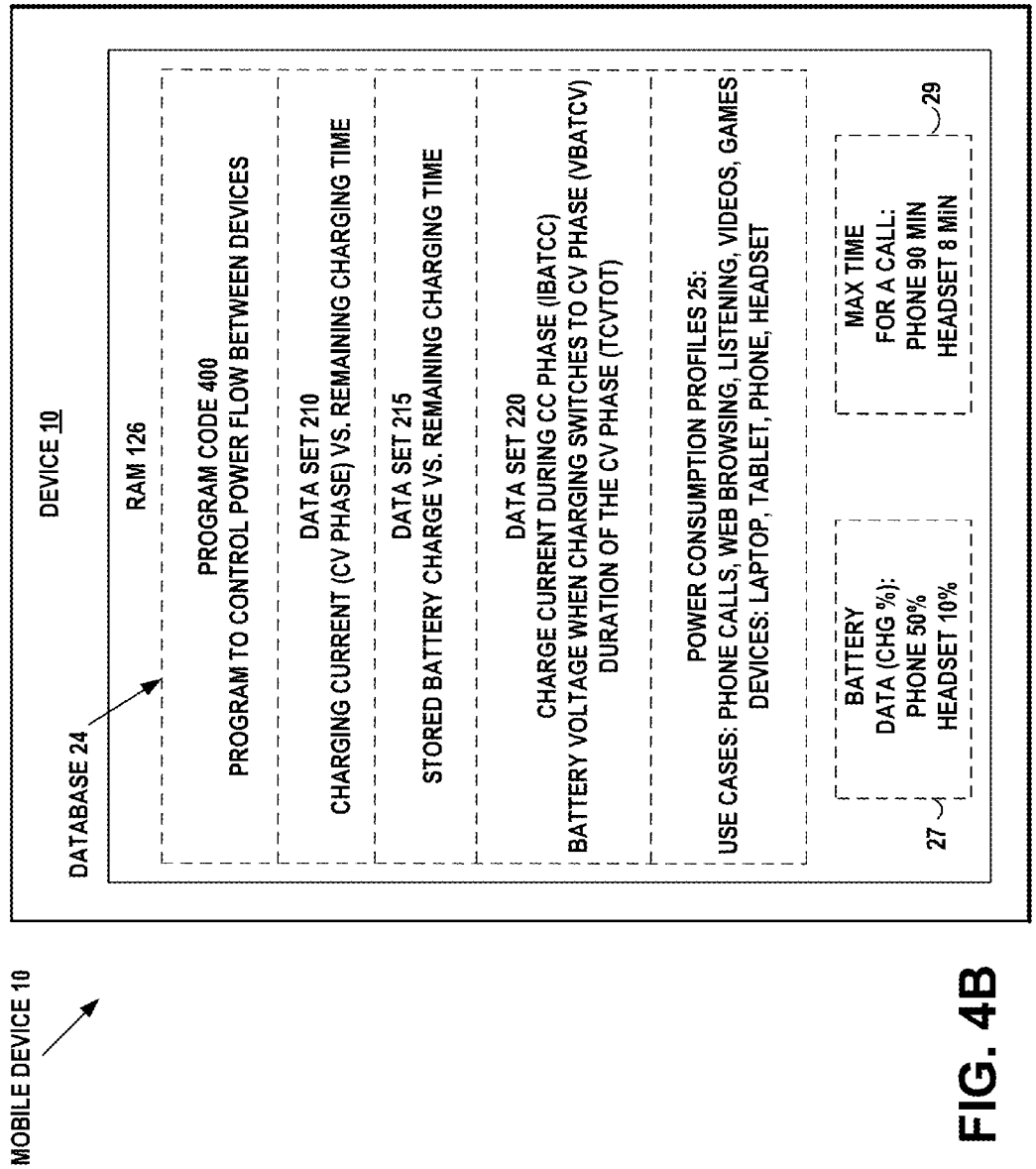
FIG. 4B is an example functional block diagram of the memory in the first device, the mobile device, of FIGS. 2A-2D, storing programs, pre-measured data sets for the rechargeable battery in the example second device, the wireless headset or other device, and tracking measurements for the present state of the battery the rechargeable battery in the example second device, the wireless headset or other device, in accordance with an embodiment of the invention.

FIG. 4B is an example functional block diagram of the memory 126 in the first device, the mobile device 10 of FIGS. 2A-2D, storing programs, pre-measured data sets for the rechargeable battery 160 in the example wireless headset or other device 20, and tracking measurements for the present state of the rechargeable battery 160 in the example second device, the wireless headset or other device 20, in accordance with an embodiment of the invention. The RAM 126 memory in the mobile device 10 stores a program 400 to control power flow between devices, a pre-measured data set 210 of data points for values of stored battery charge capacity (CAP(t)) versus time remaining to charge TREM and a pre-measured data set 215 of data points for values of charging current C(t) (CV phase) versus time remaining to charge TREM. The RAM 126 memory in the mobile device 10 may also store a pre-measured data set 220 of a value of the charge current during the constant current phase, a value of the battery voltage when charging switches to the constant voltage phase, and a value of the duration of the constant voltage phase, in accordance with an embodiment of the invention. The RAM 126 memory in the mobile device 10 may also store profiles of power consumption, the profiles indicating the charge consumption of both a phone and a headset, as shown at 25. The profile may indicate the power consumption of several types of devices, based on the use case, for example, the consumption of a smart phone for phone calls may be 1 W, for web browsing may be 0.5 W, and for games may be 2 W. Web browsing and games are highly dynamic and depending on the content whereas phone calls are more predictable. The mobile device 10 also accesses a database, to retrieve battery characteristic data for the headset's or other device's 20 rechargeable battery. The RAM 126 memory in the mobile device 10 may also store stored battery charge data for both the mobile device 10 and the headset or other device 20, as shown at 27. The RAM 126 memory in the mobile device 10 may also store the computed maximum operational time for a phone call for both the mobile device 10 and the headset or other device 20, as shown at 29.

In example embodiments of the invention, the RAM 126 memory in the mobile device 10 may also a store data set of records [Ii Vi Qi Ti] for sampling times Ti for sampled values of current Ii, voltage Vi, and charge Qi and data set of present stored battery charge CAP(t). The records [Ii Vi Qi Ti] represent the present value of the measured current Ii at the sampling time Ti, and the present value of the increment in the charge Qi flowing into the battery 160 at sequential times Ti. Optionally, the records may include present value of the measured voltage Vi at the time the time Ti. The RAM 126 memory in the mobile device 10 may also store maximum stored battery charge (MAXCAP).

The database 24 may optionally be located in a separate server and the mobile device 10 may access it over a WLAN or wide area network via the respective transceivers 112 and 114.

FIG. 5A discloses an example flow diagram of the operation of the first device, the wireless mobile device 10 with a rechargeable battery 102 of FIG. 2D, in accordance with at least one embodiment of the present invention. The steps of the flow diagram represent computer code instructions stored in the RAM and/or ROM memory of the wireless device 10, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 502: receiving by a first device, a user's selection of use case and charging criterion option for balancing stored charges in own rechargeable battery and a second device's rechargeable battery;

Step 504: monitoring by the first device, own stored battery charge;

Step 506: storing, by the first device, battery charge data from the second device;

Step 508: accessing by the first device, a database to retrieve battery characteristics data for a battery of second device, and profiles of different power consumption with different use cases;

Step 510: comparing by the first device, stored battery charge data received from second device with a threshold;

Step 512: determining by the first device if charging is required?

Step 514: computing by the first device, an amount of charging required based on user's selected use case, user's selected charging criterion for balancing charges in own battery and second device's battery, received stored battery charge data of second device, own stored battery charge, and power consumption profiles;

Step 516: beginning to transmit by the first device, power from its battery to the second device if the second device's battery requires charging or beginning to receive by the first device, power from the battery of the second device if the first device's battery requires charging; and Step 518: completing transfer of power between the first device and the second device, when monitored levels of stored battery charge in first device and in second device reach the computed required amount.

In an example embodiment of the invention, a computer program product comprises computer executable program code recorded on a computer readable non-transitory storage medium, the computer executable program code comprising:

code for receiving by a first device, a user's selection of use case and charging criterion option for balancing stored charges in own rechargeable battery and a second device's rechargeable battery;

code for monitoring by the first device, own stored battery charge;

code for storing, by the first device, battery charge data from the second device;

code for accessing by the first device, a database to retrieve battery characteristics data for a battery of second device, and profiles of different power consumption with different use cases;

code for comparing by the first device, stored battery charge data received from second device with a threshold;

code for determining by the first device if charging is required?

code for computing by the first device, an amount of charging required based on user's selected use case, user's selected charging criterion for balancing charges in own battery and second device's battery, received stored battery charge data of second device, own stored battery charge, and power consumption profiles;

code for beginning to transmit by the first device, power from its battery to the second device if the second device's battery requires charging or beginning to receive by the first device, power from the battery of the second device if the first device's battery requires charging; and code for completing transfer of power between the first device and the second device, when monitored levels of stored battery charge in first device and in second device reach the computed required amount.

Figure 5B:
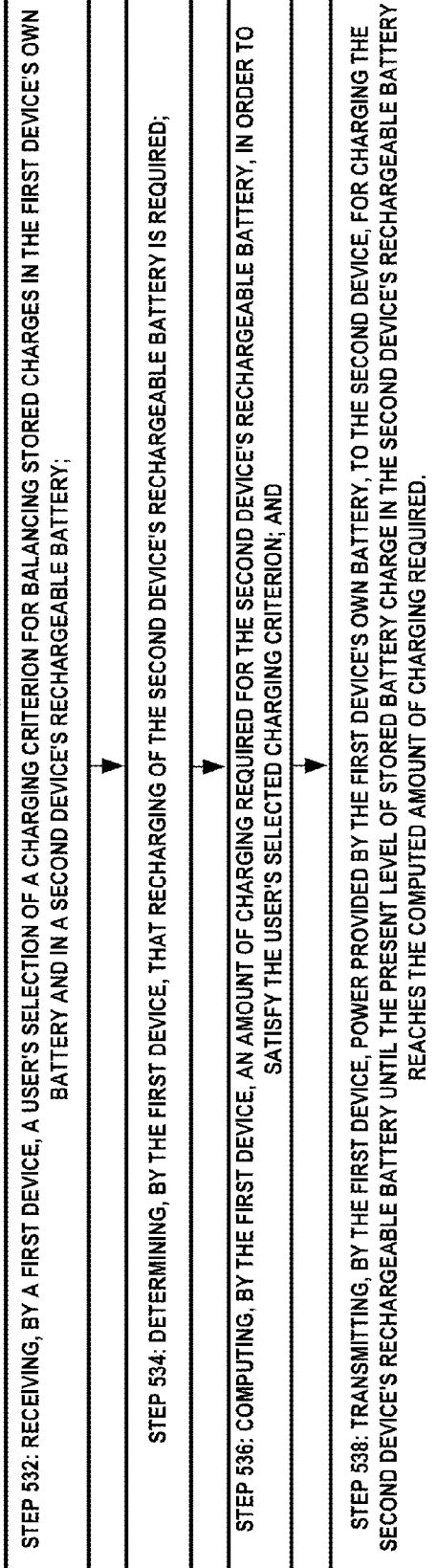
FIG. 5B is an example flow diagram of operational steps in the first device, the wireless mobile device of FIGS. 2A-2D, according to an example embodiment of the invention.

FIG. 5B is an example flow diagram 530 of operational steps in the first device, the wireless mobile device 10 of FIGS. 2A-2D, according to an example embodiment of the invention. The steps of the flow diagram represent computer code instructions stored in the RAM and/or ROM memory of the wireless device 10, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 532: receiving, by a first device, a user's selection of a charging criterion for balancing stored charges in the first device's own battery and in a second device's rechargeable battery;

Step 534: determining, by the first device, that recharging of the second device's rechargeable battery is required;

Step 536: computing, by the first device, an amount of charging required for the second device's rechargeable battery, in order to satisfy the user's selected charging criterion; and Step 538: transmitting, by the first device, power provided by the first device's own battery, to the second device, for charging the second device's rechargeable battery until the present level of stored battery charge in the second device's rechargeable battery reaches the computed amount of charging required.

In an example embodiment of the invention, a computer program product comprises computer executable program code recorded on a computer readable non-transitory storage medium, the computer executable program code comprising:

code for receiving, by a first device, a user's selection of a charging criterion for balancing stored charges in the first device's own battery and in a second device's rechargeable battery;

code for determining, by the first device, that recharging of the second device's rechargeable battery is required;

code for computing, by the first device, an amount of charging required for the second device's rechargeable battery, in order to satisfy the user's selected charging criterion; and code for transmitting, by the first device, power provided by the first device's own battery, to the second device, for charging the second device's rechargeable battery until the present level of stored battery charge in the second device's rechargeable battery reaches the computed amount of charging required.

Figure 5C:
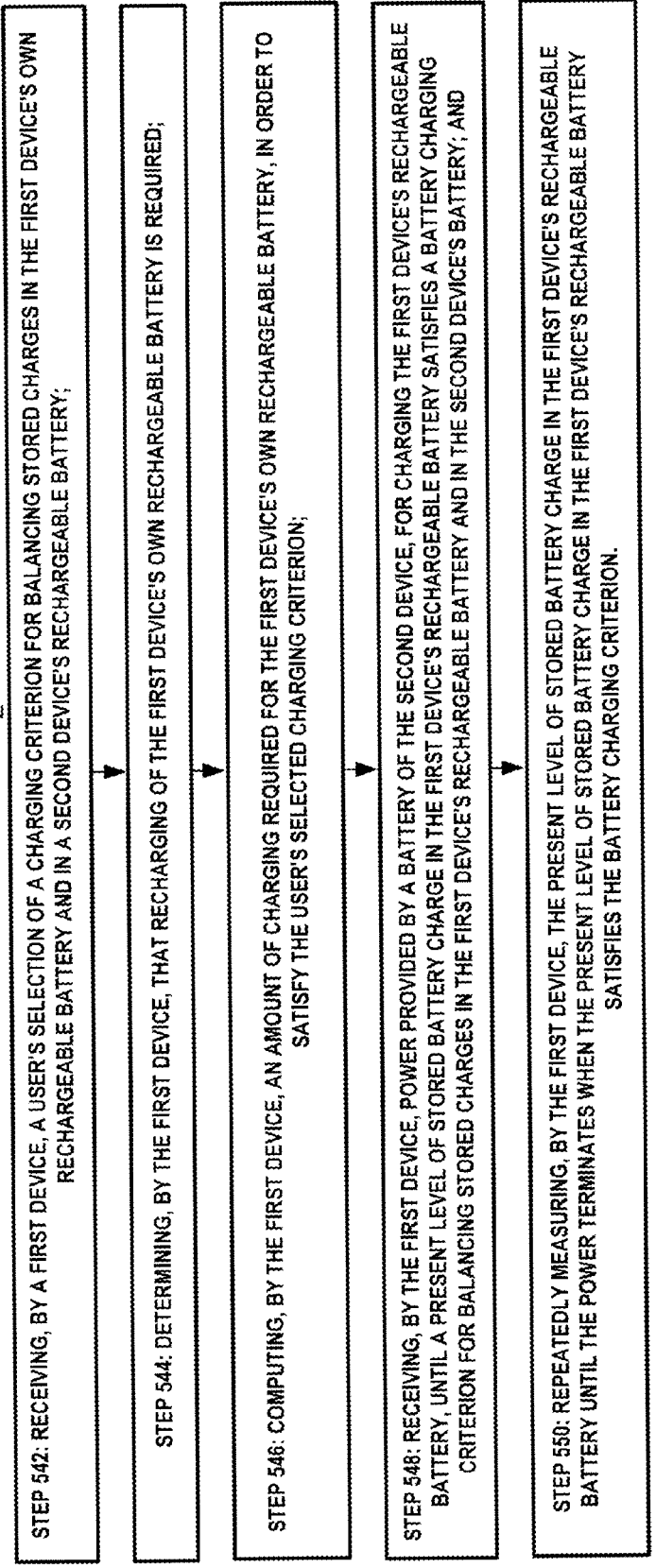
FIG. 5C is an example flow diagram of operational steps in the first device with a rechargeable battery of FIG. 2D, the wireless mobile device, according to an example embodiment of the invention.

FIG. 5C is an example flow diagram 540 of operational steps of operational steps in the first device, the wireless mobile device 10 with a rechargeable battery 102 of FIG. 2D, according to an example embodiment of the invention. The steps of the flow diagram represent computer code instructions stored in the RAM and/or ROM memory of the wireless headset or other device 10, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 542: receiving, by a first device, a user's selection of a charging criterion for balancing stored charges in the first device's own rechargeable battery and in a second device's rechargeable battery;

Step 544: determining, by the first device, that recharging of the first device's own rechargeable battery is required;

Step 546: computing, by the first device, an amount of charging required for the first device's own rechargeable battery, in order to satisfy the user's selected charging criterion;

Step 548: receiving, by the first device, power provided by a battery of the second device, for charging the first device's rechargeable battery, until a present level of stored battery charge in the first device's rechargeable battery satisfies a battery charging criterion for balancing stored charges in the first device's rechargeable battery and in the second device's battery; and Step 550: repeatedly measuring, by the first device, the present level of stored battery charge in the first device's rechargeable battery until the power terminates when the present level of stored battery charge in the first device's rechargeable battery satisfies the battery charging criterion.

In an example embodiment of the invention, a computer program product comprises computer executable program code recorded on a computer readable non-transitory storage medium, the computer executable program code comprising:

code for receiving, by a first device, a user's selection of a charging criterion for balancing stored charges in the first device's own rechargeable battery and in a second device's rechargeable battery;

code for determining, by the first device, that recharging of the first device's own rechargeable battery is required;

code for computing, by the first device, an amount of charging required for the first device's own rechargeable battery, in order to satisfy the user's selected charging criterion;

code for receiving, by the first device, power provided by a battery of the second device, for charging the first device's rechargeable battery, until a present level of stored battery charge in the first device's rechargeable battery satisfies a battery charging criterion for balancing stored charges in the first device's rechargeable battery and in the second device's battery; and code for repeatedly measuring, by the first device, the present level of stored battery charge in the first device's rechargeable battery until the power terminates when the present level of stored battery charge in the first device's rechargeable battery satisfies the battery charging criterion.

FIG. 5D is an example flow diagram 560 of operational steps in the wireless headset or other device 20 (referred to here as the "first device") of FIGS. 2A-2D, according to an example embodiment of the invention. The steps of the flow diagram represent computer code instructions stored in the RAM and/or ROM memory of the wireless headset or other device 20, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 562: receiving, by a first device from a second device, a request for stored battery charge data describing a current state of a rechargeable battery in the first device;

Step 564: measuring, by the first device, the current state of the rechargeable battery in the first device;

Step 566: transmitting, by the first device to the second device, stored battery charge data describing the current state of the first device's rechargeable battery;

Step 568: receiving, by the first device, power provided a battery of the second device, for charging the first device's rechargeable battery, until a present level of stored battery charge in the first device's rechargeable battery satisfies a battery charging criterion for balancing stored charges in the first device's rechargeable battery and in the second device's battery; and Step 570: repeatedly measuring, by the first device, the present level of stored battery charge in the first device's rechargeable battery and transmitting to the second device, information related to the present level of stored battery charge of the first device's rechargeable battery, until the power terminates when the present level of stored battery charge in the first device's rechargeable battery satisfies the battery charging criterion.

In an example embodiment of the invention, a computer program product comprises computer executable program code recorded on a computer readable non-transitory storage medium, the computer executable program code comprising:

code for receiving, by a first device from a second device, a request for stored battery charge data describing a current state of a rechargeable battery in the first device;

code for measuring, by the first device, the current state of the rechargeable battery in the first device;

code for transmitting, by the first device to the second device, stored battery charge data describing the current state of the first device's rechargeable battery;

code for receiving, by the first device, power provided a battery of the second device, for charging the first device's rechargeable battery, until a present level of stored battery charge in the first device's rechargeable battery satisfies a battery charging criterion for balancing stored charges in the first device's rechargeable battery and in the second device's battery; and code for repeatedly measuring, by the first device, the present level of stored battery charge in the first device's rechargeable battery and transmitting to the second device, information related to the present level of stored battery charge of the first device's rechargeable battery, until the power terminates when the present level of stored battery charge in the first device's rechargeable battery satisfies the battery charging criterion.

Figure 6A:
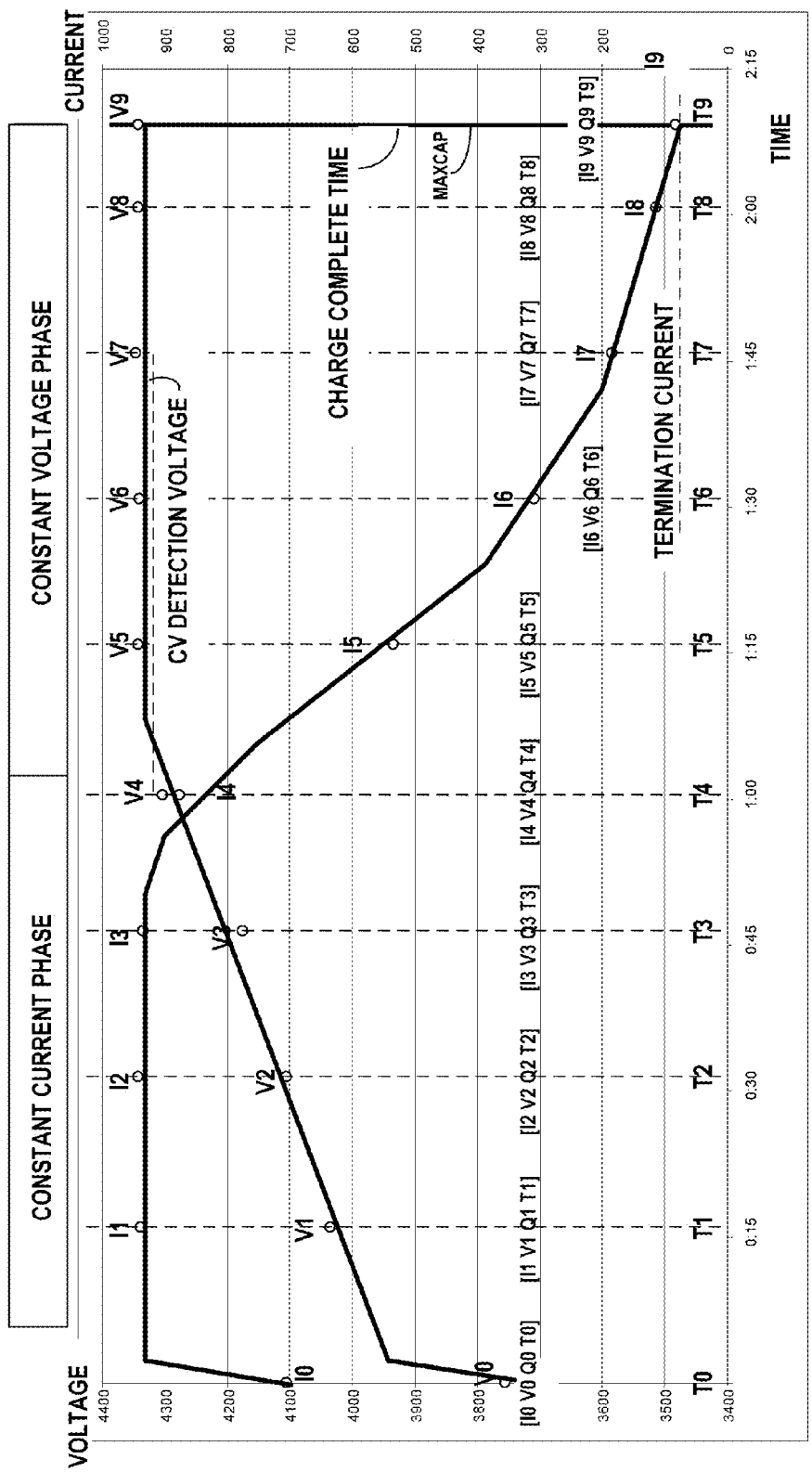
FIG. 6A is an example graph of charging with a constant current/constant voltage process, showing a graph of current vs. voltage, and further depicting the records [Ii Vi Qi Ti] corresponding to each sampling time Ti, in accordance with an embodiment of the invention.

FIG. 6A is an example graph of charging with a constant current/constant voltage process, showing a graph of current vs. voltage, and further depicting the records [Ii Vi Qi Ti] corresponding to each sampling time Ti, in accordance with an embodiment of the invention. The figure illustrates an example graph of charging with a constant current/constant voltage process, in accordance with an embodiment of the invention. Values for current I measured by the current measurement module 170 to the battery 160 are on the right side ordinate and values for the voltage V measured by the voltage measurement module 180 across the terminals of the battery 160 are on the left side ordinate. The time axis along the abscissa is divided into the constant current phase on the left portion and the constant voltage phase on the right portion. The transition from the constant current phase to the constant voltage phase occurs when the increasing load resistance R(load) of the partially charged battery 160 equals the critical resistance R(critical).

The charging of the battery 160 in the headset or other device 20 may be performed by the wireless power 50, as shown in the graph of FIG. 6A. The battery's charge state is typically tracked by the energy management program 400. At the time T0, the charge state of the battery is the residual charge Q0. The mobile device 10 may be placed in a minimally powered operating state with only its display indicating that battery charging is taking place. At the time T1, the increment in the charge Q1 that has flowed into the battery is approximately Q1=I1*(T1−T0). At the time T2, the increment in the charge Q2 that has flowed into the battery is approximately Q2=I2*(T2−T1) and at that instant T2, the present stored battery charge capacity CAP(T2) that has accumulated in the battery is the sum of Q0+Q1+Q2. At any time Tj, the present stored battery charge CAP(j) that has accumulated in the battery is the sum of Q0+Q1+Q2+ . . . +Qj. At the end of the charging operation, shown for example at T9 in FIG. 6A, when the battery 160 has reached its maximum stored battery charge MAXCAP, the charge that has accumulated in the battery is the sum of the incremental charges Q0+Q1+Q2+ . . . +Q9. The values of the charge increments Qi may be computed from the values of the current Ii measured by the current measurement module 170 at each sampling time Ti. The measured and computed values may be stored in the records [Ii Vi Qi Ti] in the dataset in the RAM 126 memory in the mobile device 10. The records [Ii Vi Qi Ti] may be available for monitoring and managing the battery in the following example processes.

Example embodiments of the invention are disclosed for estimating the remaining charging time of a rechargeable battery. Example embodiments of the invention may include the stages of: [1] Pre-measurements for each battery 160 type; [2] Calculating the initial remaining charging time estimate immediately when charging starts based on the present estimate of the stored charge battery 160 capacity; [3] Determining whether the charging is in the constant current or constant voltage phase; [4] Calculating the remaining charging time estimate during the CC phase based on the present estimate of the battery 160 stored battery charge and the actual charge current; and [5] Calculating the remaining charging time estimate during the CV phase based on the actual charge current.

Example embodiments of the invention may distinguish whether the battery 160 is presently being charged in constant current or constant voltage phase and apply different estimation inputs and formulas in each of these phases. In example embodiments of the invention, the estimation in the constant voltage phase is based on the charging current rather than on the battery 160 voltage.

Pre-Measurements for Each Combination of Device and Battery Type

In example embodiments of the invention, the method may utilize data providing mapping of remaining charging time to stored battery 160 charge or charging current (during CV phase).

Figure 6B:
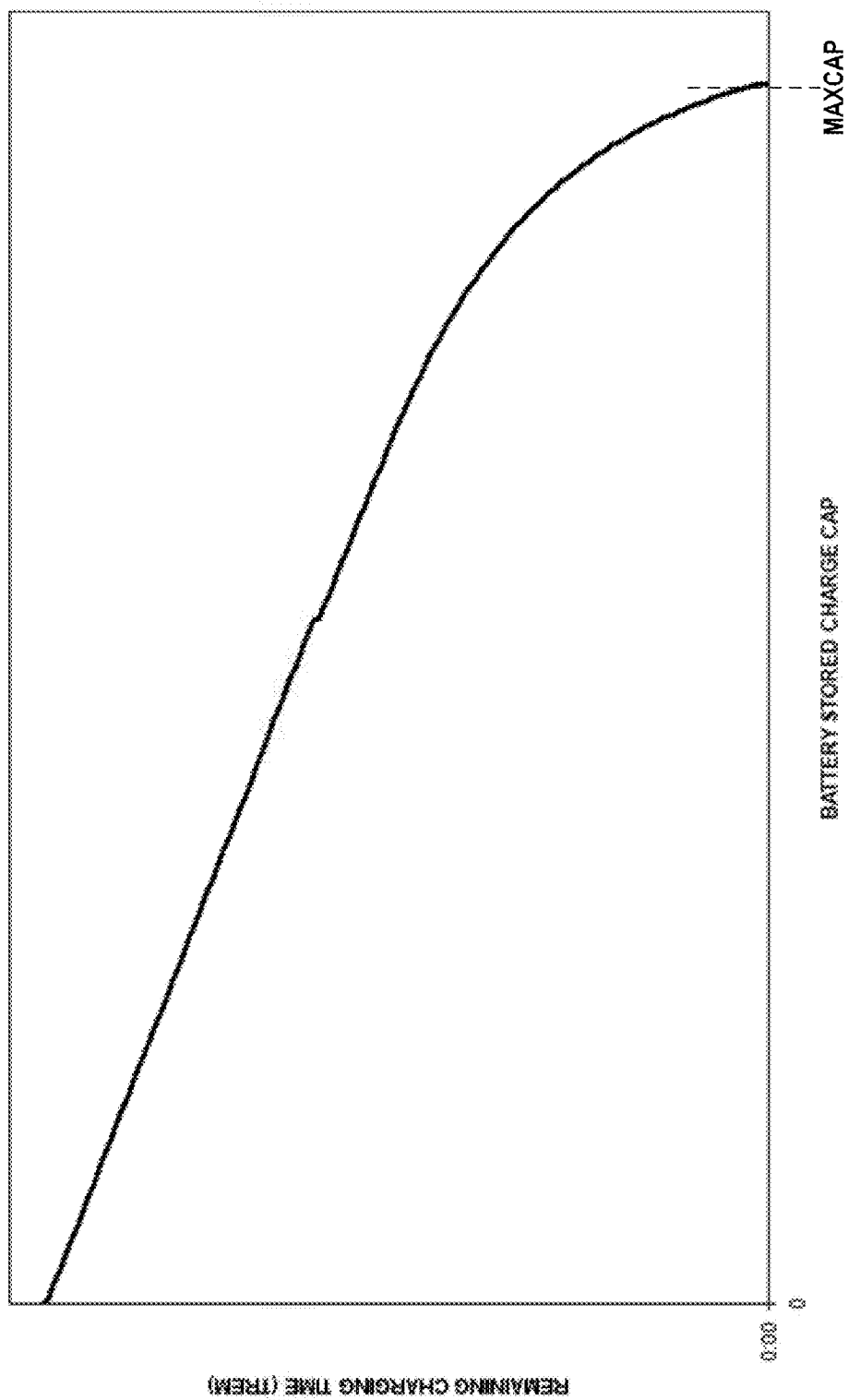
FIG. 6B is an example graph of pre-measured data set of data points for values of the battery stored charge CAP(t) versus remaining charging time TREM, in accordance with an embodiment of the invention.
Figure 6C:
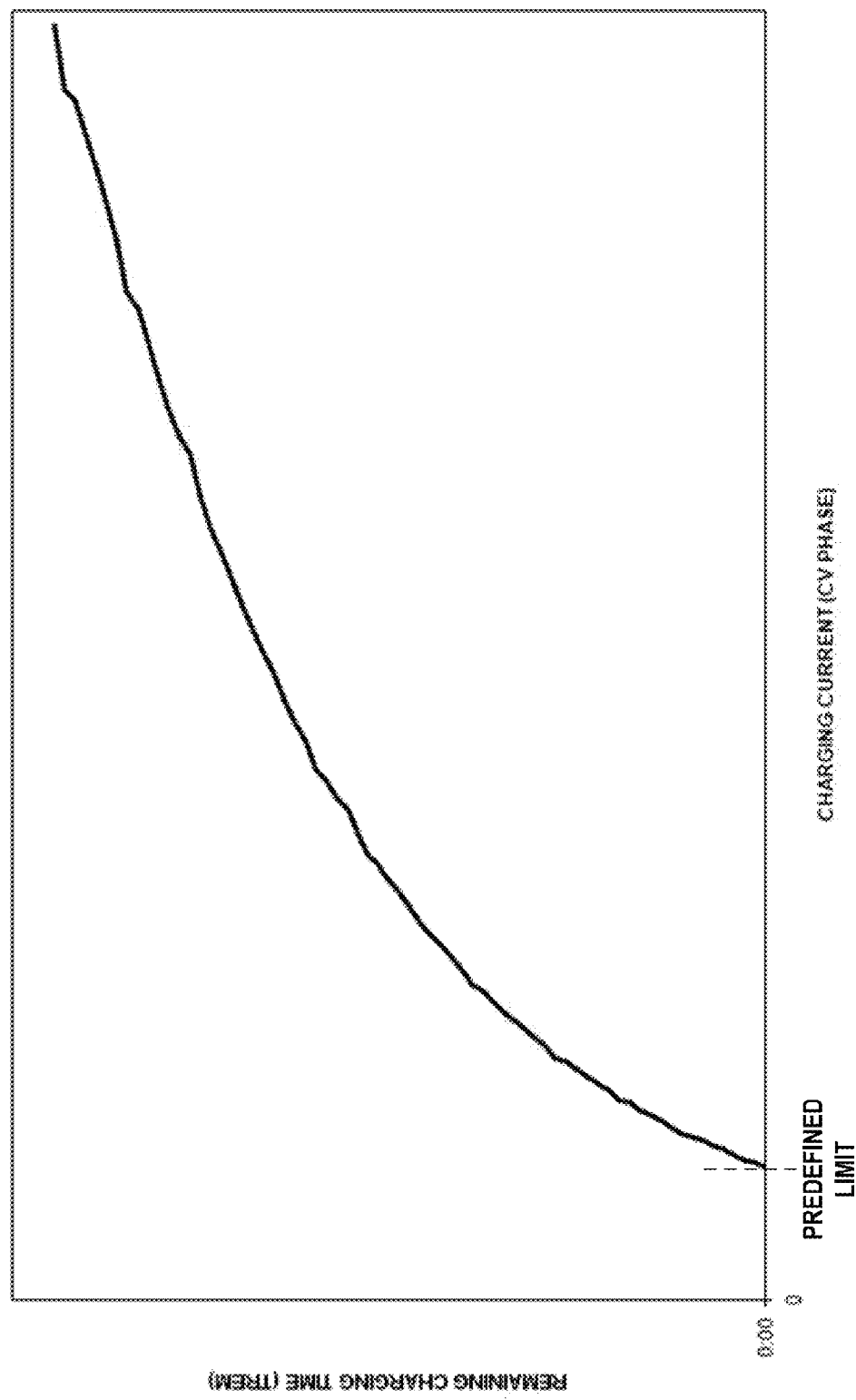
FIG. 6C is an example graph of pre-measured data set of data points for values of charging current C(t) (CV phase) versus remaining charging time TREM, in accordance with an embodiment of the invention.

This data may be stored in the mobile device 10 as a pre-measured data set 215 of data points for values of stored battery charge CAP(t) versus remaining charging time TREM shown in FIG. 6B and a pre-measured data set 210 of data points for values of charging current C(t) (CV phase) versus remaining charging time TREM shown in FIG. 6C. This data is unique for each battery 160 model. The data may be pre-stored in the mobile device 10 or may be downloaded or updated from a server in case a new battery model is available. The capacity of a battery is the quantity of electrical charge stored in the battery at a given level. The capacity of a fully charged battery is usually measured in amp-hours (AH) or milliamp-hours (mAH), and is a measure of the size of the battery. As the charging current delivers electrical charge to the battery, the energy of the battery increases and is determined by the product of the charge stored and the battery voltage.

FIG. 6B is an example graph of pre-measured data set 215 of data points for values of the battery stored charge CAP(t) versus remaining charging time TREM.

FIG. 6C is an example graph of pre-measured data set 210 of data points for values of charging current C(t) (CV phase) versus remaining charging time TREM.

In example embodiments of the invention, the data in datasets 210 and 215 may be measured for a particular battery 160. For making the measurements, there is no special hardware needed. During the measurement, the load of the audio and data circuits 156 may be constant and represent the idle consumption, and merely indicates that charging in underway. It is also possible that the audio and data circuits 156 is off during charging and also during the pre-measurements. The measured data for datasets 210 and 215 may then be converted to a static data structure as a record or C-Language struct, to be operated on by the energy management software 400. It may be sufficient to store, for example, 50 data points, so the size of the data sets 210 and 215 may be small, for example on the order of 300 bytes.

Along with the measured data for datasets 210 and 215, the following information may be stored in the mobile device 10 as dataset 220 for each combination of mobile device 10 battery 160 type: [1] Charge current during CC phase (IBATCC); [2] Battery 160 voltage when the charging switches to the CV phase (VBATCV). If the battery 160 voltage slightly increases during the CV phase, a value of the lowest voltage in the constant voltage phase may be chosen; and [3] Duration of the CV phase (TCVTOT).

In example embodiments of the invention, the present stored battery charge CAP(t) data set and the maximum stored battery charge MAXCAP may be stored in the RAM 126 memory in the mobile device 10. Optionally, the records [Ii Vi Qi Ti] collected during the charging of the battery 160 in the headset or other device 20, may be stored in the dataset in the RAM 126 memory in the mobile device 10. These several data sets may be stored in the RAM 126 memory in the mobile device 10, as shown in FIG. 4. Collecting and storing the value Vi in the record is optional.

Calculating the Initial Remaining Charging Time Estimate

For enhanced user experience, the remaining charging time estimate may be shown to the user on a display of the mobile device 10 right after the wireless charging begins. However, the following factors may have an impact on initially calculating the estimate: [1] The power consumption may momentarily be higher than the average during charging, for example, because the display may be automatically turned on when the wireless charging begins; and [2] The processor 158 may be programmed for step charging, wherein charging may be started with a lower current and then be gradually raised to the maximum charging current (step charging).

For these reasons, the charge current measurements taken right after the wireless charging begins, may not reflect the likely average charge current during the charging operation. The solution may be to use a predefined initial charge current value in the calculation and then proceed with the estimation.

Determining Whether the Charging is in the CC or CV Phase.

CCCV charging consists of the Constant current phase and the Constant voltage phase. The remaining charging time estimation is done differently in the CC and the CV phases, thus requiring a determination of the present charging phase.

Initially, charging is considered to be in the CC phase. The charging is considered to move from the CC phase to the CV phase when both of the following are true:
 1. VBAT>=VBATCV−VBATCVOFFSET
 2. VBATTREND<=VBATTRENDLIMIT
 Where:
 VBAT is the measured battery 160 voltage. It may be filtered using for example an average filter over 60 seconds and a 5 second sampling interval.
 VBATCV is the pre-measured CV voltage.
 VBATCVOFFSET is a pre-defined constant, such as 50 mV. The purpose of this constant is to make sure that the CV phase is detected in all devices 100 despite the charge voltage regulation and VBAT measurement inaccuracy.
 VBATTREND is the difference of VBAT now and an earlier VBAT, taken for example 60 seconds ago.
 VBATTRENDLIMIT is a predefined constant, such as 10 mV It may also happen that charging switches from the CV phase back to the CC phase. This may happen for example when audio and data circuits 156 energy consumption significantly increases and the maximum output current of the CC/CV charger IC 154 is not sufficient to maintain the regulated charging voltage. This situation may be detected by a lower VBAT. The charging is considered to move from CV phase back to the CC phase when the following is true:
 3. VBAT<VBATCV−VBATCVOFFSET−VBATCVHYS
 Where:
 VBATCVHYS is a predefined hysteresis prevention limit, such as 20 mV CCCV charging with the CV detection voltage (VBATCV−VBATCVOFFSET) is illustrated in FIG. 6A.

Calculating the Remaining Charging Time Estimate During the CC Phase

The remaining charging time estimate during the CC phase is calculated in the following way:
 1. TCAP=T(CAP), where T represents the pre-measured data that provides the remaining charging time estimate based on the battery 160 stored battery charge estimate CAP. The pre-measured data set 215 of data points provides values of the battery stored charge CAP(t) versus remaining charging time. Since the pre-measured data is stored as a set of data-points in data set 215, interpolation is used to find the time more accurately. T may also present a mathematical model that fits to the pre-measured data. The present stored battery charge CAP may also be available as a stored value in the data set. For example, the current measurement module 170 may be continuously monitored by the processor 158 to keep track of both discharging the battery 160, as well as charging the battery, thereby maintaining an updated value for the present stored charge CAP in the battery.
 2. The remaining time TCAP, as viewed in the CC phase, is the sum of the expected remaining time in both the CC phase and the CV phase. The pre-measured duration of the CV-phase is TCVTOT. Thus, the duration of the CC-phase TCC=TCAP−TCVTOT.
 3. The duration of the CC-phase TCC may be corrected by the ratio of the charging current measured in the pre-measurements (IBATCC) and the actual present charging current (IBAT): TCCCOR=TCC*(IBATCC/IBAT).
 4. The remaining charging time is the sum of the corrected remaining time of the CC phase and the total duration of the CV phase: TREM=TCCCORR+TCV If the charging is detected to be in the CC phase, even though TCAP<pre-measured duration of the CV-phase TCVTOT, then TCAP is used as the result: The remaining charging time estimate TREM=TCAP.

The value of TREM is then displayed on the display 125 to the user as remaining charging time estimate.

Calculating the Remaining Charging Time Estimate During the CV Phase

A voltage-based approach may not be applicable or may be inaccurate in the constant voltage phase. Also, an approach based on the estimated stored battery charge (as used in the initial/CC phase) may be inaccurate because the charge rate near end of the charge is relatively low and a small error in the stored battery charge may then cause an error in the remaining charging time.

On the other hand, the charging current (IBAT) behaves in a very predictable way during the CV phase. The charging current decreases and when it reaches the termination limit, the charging is considered complete.

The remaining charging time during the CV phase may thus be estimated as a mapping from the charging current, using the pre-measured data: TREM=T(IBAT). Since the pre-measured data is stored as a set of data-points in data set 210, interpolation is used to find the time more accurately. T may also be represented as a mathematical model that fits to the pre-measured data.

Post-Filtering

During the CC phase, the current consumed by the audio and data circuits 156 affects the remaining charging time. In example embodiments of the invention, the method accounts for the current consumed by the audio and data circuits 156, based on the estimation that the audio and data circuits 156 consumption stays the same during the rest of the charge. There may be sudden, but temporary, changes in the audio and data circuits 156 energy consumption during charging. A simple example is that normally a light may be turned off, but the user turns it on for a short time. When the light is turned on, the user may see the display of the remaining charging time estimate. It may then be inaccurate to show a value for the remaining charging time estimate based on this temporarily increased energy consumption.

When the charging proceeds from the CC mode to the CV mode, the remaining charging time estimation technique becomes more accurate. It is advantageous that the later CV phase of the charge may be estimated more accurately. However, it is not optimal if the remaining charging time estimation suddenly changes during charging.

For these reasons, a form of post filtering may be applied to the results produced by the described method. An applicable filter may be a moving average filter described, as follows:

1. The estimated remaining charging duration is calculated as described for example once in a minute.
2. Each estimated remaining charging duration is converted to estimated charge completion instant by adding the present timestamp to it.
3. An average is taken of the most recent estimated charge completion instants, for example the last four values.
4. The average of the estimated charge completion instants is then converted to estimated remaining charging duration by subtracting the current timestamp from it.

In an example embodiment of the invention, the battery 160 charge level may be expressed in various other formats on the display screen of the mobile device 10, such as an arbitrary scale (for example 0-10), in graphical formats (for example, battery bars), color or shape of a symbol, remaining operating time (for example, an announcement "The current battery charge allows XX minutes of music playback or YY minutes of telephone calling.").

FIG. 6B is an example graph of pre-measured data set of data points for values of the battery stored charge CAP(t) versus remaining charging time TREM.

FIG. 6C is an example graph of pre-measured data set of data points for values of charging current C(t) (CV phase) versus remaining charging time TREM.

Figure 7:
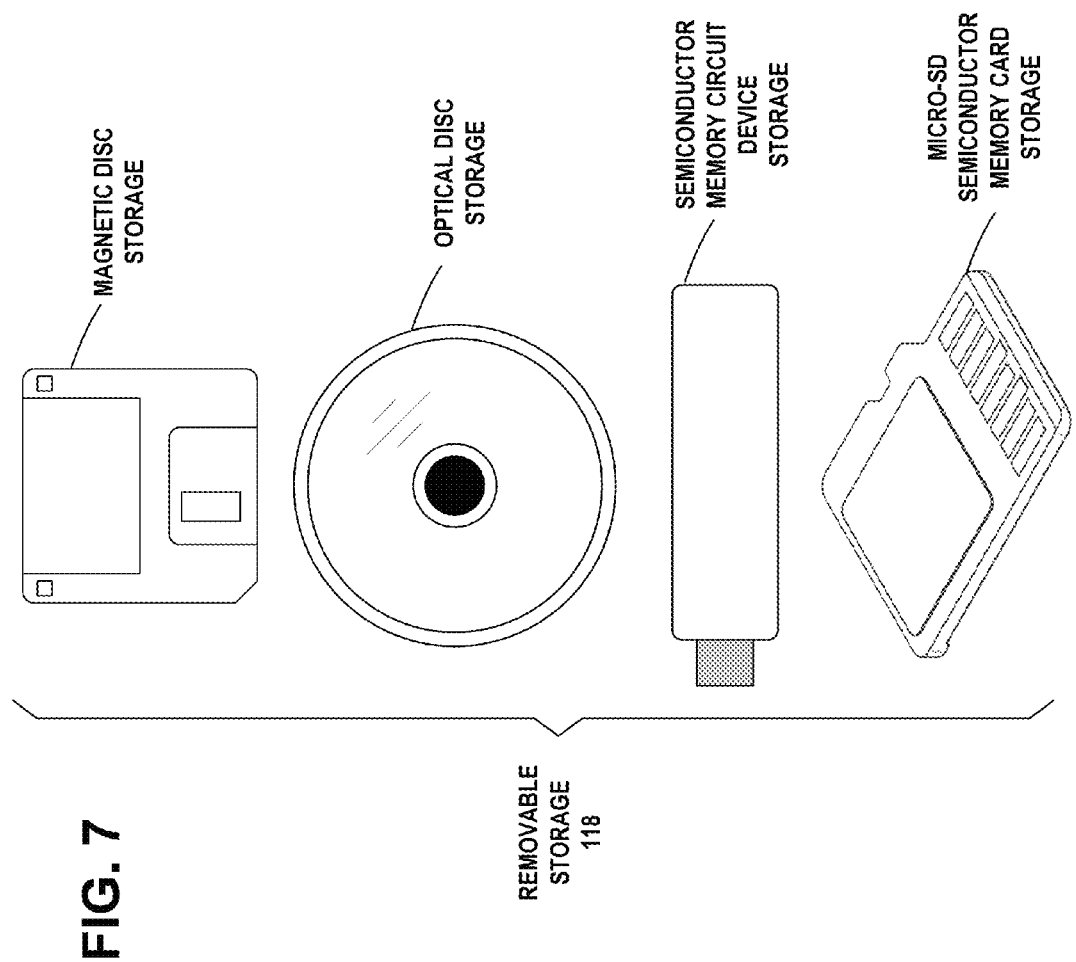
FIG. 7 illustrates an example embodiment of the invention, wherein examples of removable storage media are shown, based on magnetic, electronic and/or optical technologies, such as magnetic disks, optical disks, semiconductor memory circuit devices and micro-SD memory cards (SD refers to the Secure Digital standard) for storing data and/or computer program code as an example computer program product, in accordance with at least one embodiment of the present invention.

FIG. 7 illustrates an example embodiment of the invention, wherein examples of removable storage media 118 are shown, based on magnetic, electronic and/or optical technologies, such as magnetic disks, optical disks, semiconductor memory circuit devices and micro-SD memory cards (SD refers to the Secure Digital standard) for storing data and/or computer program code as an example computer program product, in accordance with at least one embodiment of the present invention.

FIG. 8A illustrates an example embodiment of the invention, wherein a portable laptop computer wirelessly charges the rechargeable battery in the mobile device 10. The mobile device 10 uses the following example settings: [1] use case is receiving charge for the rechargeable battery 102 of the mobile device 10, [2] the charging criterion is to charge the battery 102 to 100% of its maximum charging capacity, and [3] the power consumption profile of the battery 102 of the mobile device 10 for phone calls, in accordance with at least one embodiment of the present invention.

FIG. 8B illustrates an example embodiment of the invention, wherein the battery in the mobile device 10 wirelessly charges a mobile phone 800A using the following example settings: [1] use case is transmitting a charge for the rechargeable battery of the mobile phone 800A, [2] the charging criterion is to charge the battery of the mobile phone 800A to 50% of its maximum charging capacity, and [3] the power consumption profile of the battery of the mobile phone 800A for phone calls, in accordance with at least one embodiment of the present invention.

FIG. 8C illustrates an example embodiment of the invention, wherein the battery in the mobile device 10 wirelessly charges a tablet or smart phone 800B using the following example settings: [1] use case is transmitting a charge for the rechargeable battery of the tablet or smart phone 800B for video display, [2] the charging criterion is to charge the battery of the tablet or smart phone 800B to 50% of its maximum charging capacity, and [3] the power consumption profile of the battery of the tablet or smart phone 800B for video display, in accordance with at least one embodiment of the present invention.

Figure 8D:
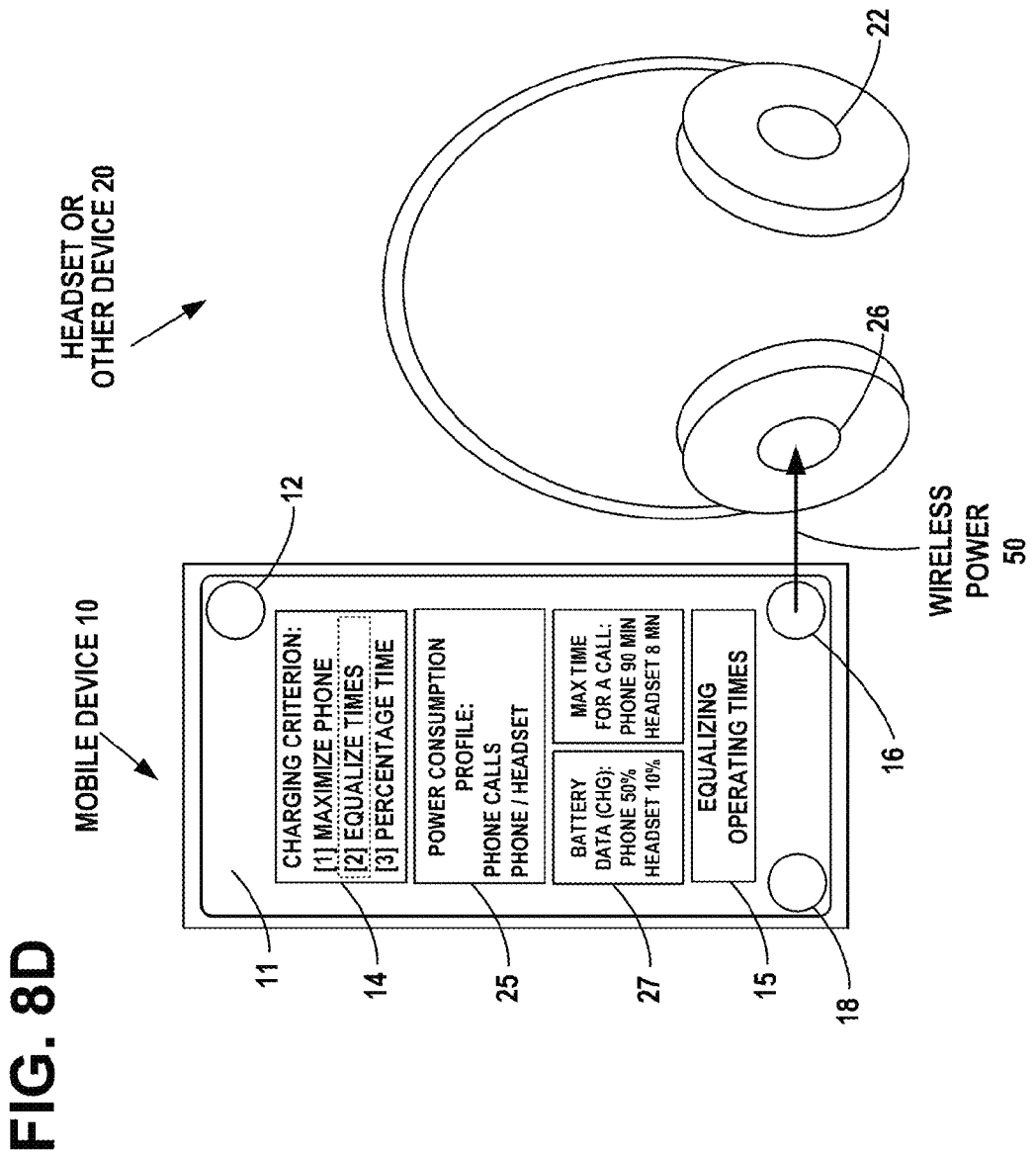
FIG. 8D illustrates an example embodiment of the invention, wherein the rechargeable battery in the mobile device 10 wirelessly charges the headset or other device, using a profile of power consumption for the headset or other device, in accordance with at least one embodiment of the present invention.

FIG. 8D illustrates an example embodiment of the invention, wherein the rechargeable battery in the mobile device 10 wirelessly charges the headset or other device 20, using the following example settings: [1] use case is transmitting a charge for the rechargeable battery of the headset or other device 20 for equalizing operating times, [2] the charging criterion is to charge the battery of the headset or other device 20 to equalize operating times, and [3] the power consumption profile of the battery of the headset or other device 20 for listening, in accordance with at least one embodiment of the present invention.

Figure 8E:
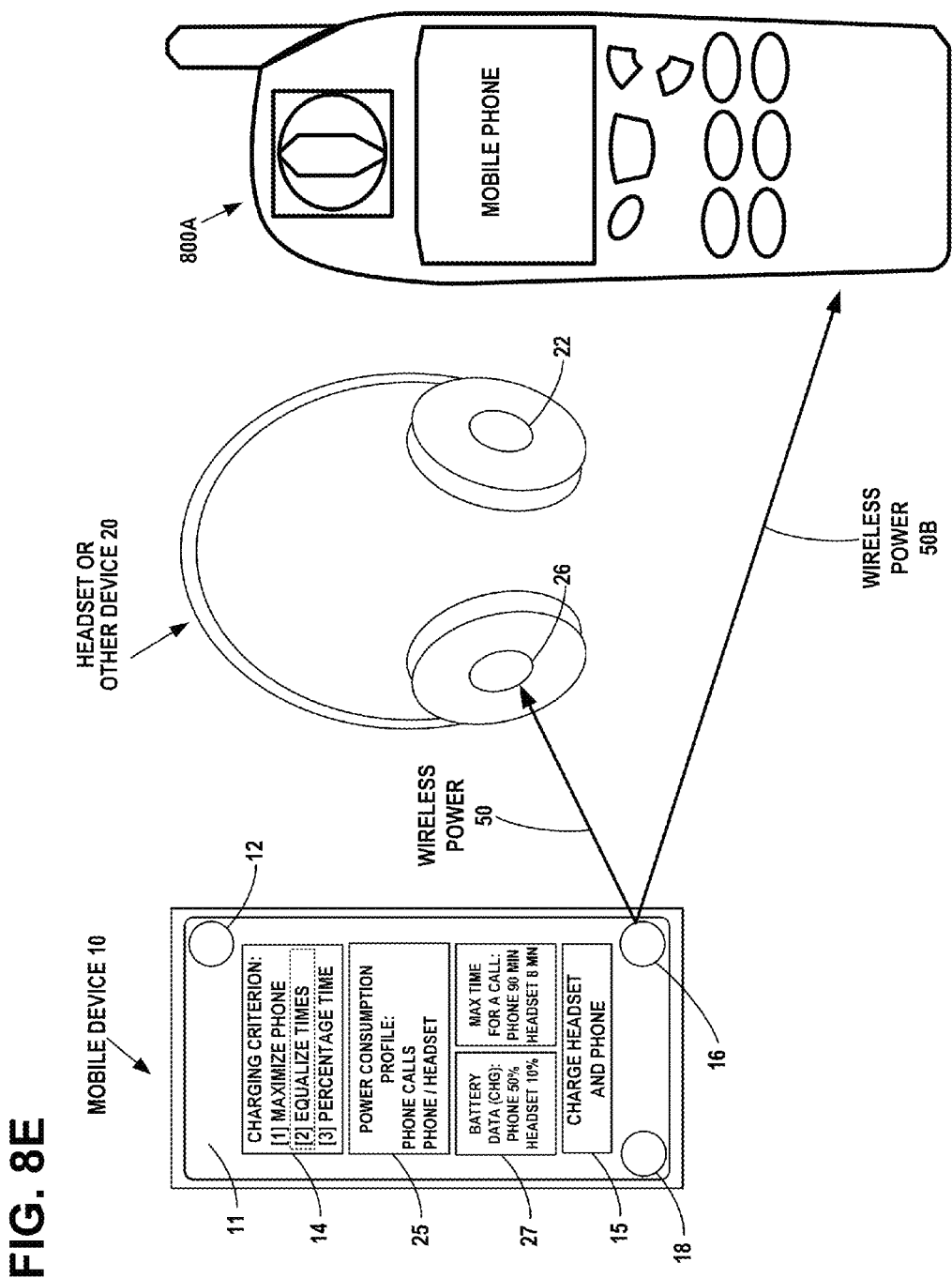
FIG. 8E illustrates an example embodiment of the invention, wherein the rechargeable battery in the mobile device 10 simultaneously wirelessly charges a mobile phone using a profile of power consumption for the mobile phone, and also the headset or other device, using a profile of power consumption for the headset or other device, in accordance with at least one embodiment of the present invention.

FIG. 8E illustrates an example embodiment of the invention, wherein the rechargeable battery in the mobile device 10 simultaneously wirelessly charges a mobile phone 800A using a profile of power consumption for the mobile phone, and also the headset or other device 20, using a profile of power consumption for the headset or other device 20, in accordance with at least one embodiment of the present invention. Two or more devices, such as a laptop 800C, tablet 800B, phone 800A, and headset 20 may be simultaneously recharged in this manner. In an example embodiment of the invention, there may be sequential charging of multiple rechargeable devices. For example, the laptop 800C may charge the tablet 800B, the tablet 800B may charge the phone 800A, and the phone 800A may charge the headset 20 in a simultaneous or sequential daisy-chain sequence. Still further, the multiple rechargeable devices may be nested wherein the laptop 800C wants to retain sufficient battery capacity for one hour of document editing, the tablet 800B wants to retain sufficient battery capacity for two hours of reading an E-book, and the phone 800A wants to retain sufficient battery capacity for three hours of phone calls and have an equalized operational time for the headset 20.

Popular short-range communication technologies include Bluetooth basic rate/enhanced data rate (BR/EDR), Bluetooth Low Energy (LE), IEEE 802.11 wireless local area network (WLAN), Wireless Universal Serial Bus (WUSB), Ultra Wide-band (UWB), ZigBee (IEEE 802.15.4, IEEE 802.15.4a), and near field communication technologies, such as radio frequency identification (RFID) and near field communication (NFC) technology that enable contactless identification and interconnection of wireless devices. Bluetooth Technology provides an example of a wireless short-range communication protocol applied to communications between a wireless charger device and a rechargeable battery-powered device.

An example of the Bluetooth™ short-range communications protocol is described, for example, Bluetooth™ devices is described in the Bluetooth™ Specification, Version 4, Jun. 30, 2010, incorporated herein by reference.

An example of the Radio Frequency Identification (RFID) short-range communications protocol is described, for example, ISO 11785 (air interface protocol), ISO 14443 (air interface protocol), and ISO 15693, incorporated herein by reference.

An example of the Near Field Communication (NFC) short-range communications protocol is described, for example, in ISO/IEC 14443 and ISO/IEC 18092, incorporated herein by reference.

An example of the Infrared Data Association (IrDA) short-range communications protocol is described, for example, in IrDA Link Access Protocol, v1.1 (1996), incorporated herein by reference.

An example of the Ultra Wide Band (UWB) short-range communications protocol is described, for example, in WiMedia Common Radio Platform Specification, Version 1.5 (2010), incorporated herein by reference.

An example of the IEEE 802.11 WLAN communications protocol is described, for example, in IEEE 802.11-2012, Wireless Medium Access Control (MAC) and Physical Layer (PHY) Specifications, 29 Mar. 2012 (incorporated herein by reference).

In an example embodiment of the invention, an apparatus comprises:

means for receiving by a first device, a user's selection of use case and charging criterion option for balancing stored charges in own rechargeable battery and a second device's rechargeable battery;

means for monitoring by the first device, own stored battery charge;

means for storing, by the first device, battery charge data from the second device;

means for accessing by the first device, a database to retrieve battery characteristics data for a battery of second device, and profiles of different power consumption with different use cases;

means for comparing by the first device, stored battery charge data received from second device with a threshold;

means for determining by the first device if charging is required?

means for computing by the first device, an amount of charging required based on user's selected use case, user's selected charging criterion for balancing charges in own battery and second device's battery, received stored battery charge data of second device, own stored battery charge, and power consumption profiles;

means for beginning to transmit by the first device, power from its battery to the second device if the second device's battery requires charging or beginning to receive by the first device, power from the battery of the second device if the first device's battery requires charging; and means for completing transfer of power between the first device and the second device, when monitored levels of stored battery charge in first device and in second device reach the computed required amount.

In an example embodiment of the invention, an apparatus comprises:

means for receiving, by a first device, a user's selection of a charging criterion for balancing stored charges in the first device's own battery and in a second device's rechargeable battery;

means for determining, by the first device, that recharging of the second device's rechargeable battery is required;

means for computing, by the first device, an amount of charging required for the second device's rechargeable battery, in order to satisfy the user's selected charging criterion; and means for transmitting, by the first device, power provided by the first device's own battery, to the second device, for charging the second device's rechargeable battery until the present level of stored battery charge in the second device's rechargeable battery reaches the computed amount of charging required.

In an example embodiment of the invention, an apparatus comprises:

means for receiving, by a first device, a user's selection of a charging criterion for balancing stored charges in the first device's own rechargeable battery and in a second device's rechargeable battery;

means for determining, by the first device, that recharging of the first device's own rechargeable battery is required;

means for computing, by the first device, an amount of charging required for the first device's own rechargeable battery, in order to satisfy the user's selected charging criterion;

means for receiving, by the first device, power provided by a battery of the second device, for charging the first device's rechargeable battery, until a present level of stored battery charge in the first device's rechargeable battery satisfies a battery charging criterion for balancing stored charges in the first device's rechargeable battery and in the second device's battery; and means for repeatedly measuring, by the first device, the present level of stored battery charge in the first device's rechargeable battery until the power terminates when the present level of stored battery charge in the first device's rechargeable battery satisfies the battery charging criterion.

In an example embodiment of the invention, an apparatus comprises:

means for receiving, by a first device from a second device, a request for stored battery charge data describing a current state of a rechargeable battery in the first device;

means for measuring, by the first device, the current state of the rechargeable battery in the first device;

means for transmitting, by the first device to the second device, stored battery charge data describing the current state of the first device's rechargeable battery;

means for receiving, by the first device, power provided a battery of the second device, for charging the first device's rechargeable battery, until a present level of stored battery charge in the first device's rechargeable battery satisfies a battery charging criterion for balancing stored charges in the first device's rechargeable battery and in the second device's battery; and means for repeatedly measuring, by the first device, the present level of stored battery charge in the first device's rechargeable battery and transmitting to the second device, information related to the present level of stored battery charge of the first device's rechargeable battery, until the power terminates when the present level of stored battery charge in the first device's rechargeable battery satisfies the battery charging criterion.

Using the description provided herein, the embodiments may be implemented as a machine, process, or article of manufacture by using standard programming and/or engineering techniques to produce programming software, firmware, hardware or any combination thereof.

Any resulting program(s), having computer-readable program code, may be embodied on one or more computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable medium.

As indicated above, memory/storage devices include, but are not limited to, disks, optical disks, removable memory devices such as smart cards, SIMs, WIMs, semiconductor memories such as RAM, ROM, PROMS, etc. Transmitting mediums include, but are not limited to, transmissions via wireless communication networks, the Internet, intranets, telephone/modem-based network communication, hard-wired/cabled communication network, satellite communication, and other stationary or mobile network systems/communication links.

Although specific example embodiments have been disclosed, a person skilled in the art will understand that changes can be made to the specific example embodiments without departing from the spirit and scope of the invention.

What is claimed is:

1. A method, comprising:
   receiving, by a first device, a user's selection of a charging criterion for balancing stored charges in the first device's own battery and in a second device's rechargeable battery, and a use case characterizing a use of the first and second devices;
   monitoring, by the first device, a present level of stored battery charge in the second device's rechargeable battery and a present level of stored battery charge in the first device's own battery;
   accessing, by the first device, battery characteristics data for the battery of the second device, and a profile of power consumption of both the first and second devices for the use case selected by the user characterizing the use of the first and second devices;
   determining, by the first device, from the profile of power consumption of both the first and second devices for the use case selected by the user characterizing the use of the first and second devices, charge consumption of the first device for selected use case and charge consumption of the second device for selected use case;
   determining, by the first device, whether recharging of either the first or the second device's rechargeable battery is required, based on whether the stored battery charges in the first device and in the second device are sufficient to satisfy the user's selected charging criterion for the selected use case;
   computing, by the first device, an amount of charging required for either the first or the second device's rechargeable battery, in order to satisfy the user's selected charging criterion for balancing stored charges in the first device's own battery and in the second device's rechargeable battery for the profile of power consumption of both the first and second devices for the selected use case; and
   controlling, by the first device, power flow between the first and second devices, by transmitting, by the first device, power provided by the first device's own battery, to the second device, for charging the second device's rechargeable battery until the present level of stored battery charge in the second device's rechargeable battery reaches the computed amount of charging required, if charging of the second device's rechargeable battery is determined to be required, and by receiving power, by the first device, from the second device, provided by the second device's rechargeable battery, for charging the first device's rechargeable battery until the present level of stored battery charge in the first device's rechargeable battery reaches the computed amount of charging required, if charging of the first device's rechargeable battery is determined to be required.

2. The method of claim 1, further comprising:
   transmitting, by the first device to the second device, a request for stored battery charge data describing a current state of the rechargeable battery in the second device;
   receiving, by the first device, stored battery charge data from the second device describing the current state of its rechargeable battery;
   accessing, by the first device, a database, to retrieve battery characteristic data for the second device's rechargeable battery;
   comparing, by the first device, the stored battery charge data received from the second device with a recharging threshold; and
   determining, by the first device, that recharging of the second device's rechargeable battery is required, based on the comparison.

3. The method of claim 1, further comprising:
   monitoring, by the first device, a present level of stored battery charge in the second device's rechargeable battery and a present level of stored battery charge in the first device's own battery; and
   terminating, by the first device, the transmitting of power to the second device, when the present level of stored battery charge in the second device's rechargeable battery reaches the computed amount of charging required for the second device's rechargeable battery.

4. The method of claim 2, further comprising:
   wherein the retrieved battery characteristic data for the second device's rechargeable battery, includes battery maximum capacity and recharging threshold data, for the second device's rechargeable battery.

5. The method of claim 2, further comprising:
   wherein the recharging threshold includes an accessed battery maximum capacity and an accessed recharging threshold data for the second device's rechargeable battery.

6. The method of claim 1, further comprising:
   wherein the computing of the amount of charging required for the second device's rechargeable battery is based on the received stored battery charge data describing the second device's rechargeable battery, an accessed maximum capacity of the second device's rechargeable battery, and stored battery charge in the first device's own battery.

7. The method of claim 1, further comprising:
   accessing, by the first device, a database, to retrieve battery characteristic data for at least one of the first device's battery or the second device's battery, including at least one profile of different power consumption with different use cases characterizing different uses of the first and second devices; and
   computing the amount of charging required for the second device's rechargeable battery, based on the at least one profile of different power consumption with the different use cases.

8. The method of claim 1, further comprising:
   wherein the power provided by the first device's own battery, to the second device, is at least one of power transmitted wirelessly to the second device or power transmitted via a wire to the second device.

9. The method of claim 1, further comprising:
wherein the first device is either mobile or stationary and the second device is either mobile or stationary.

10. An apparatus, comprising:
at least one processor;
at least one memory including computer program code;
the at least one memory and the computer program code configured to, with the at least one processor, cause the apparatus at least to:
receive a user's selection of a charging criterion for balancing stored charges in the apparatus' own battery and in a second device's rechargeable battery, and a use case characterizing a use of the apparatus and second devices;
monitor a present level of stored battery charge in the second device's rechargeable battery and a present level of stored battery charge in the apparatus' own battery;
access battery characteristics data for the battery of the second device, and a profile of power consumption of both the apparatus and second device for the use case selected by the user characterizing the use of the apparatus and second device;
determine from the profile of power consumption of both the apparatus and second device for the use case selected by the user characterizing the use of the apparatus and second device, charge consumption of the apparatus for selected use case and charge consumption of the second device for selected use case;
determine whether recharging of either the apparatus' or the second device's rechargeable battery is required, based on whether the stored battery charges in the apparatus and in the second device are sufficient to satisfy the user's selected charging criterion for the selected use case;
compute an amount of charging required for either the apparatus' or the second device's rechargeable battery, in order to satisfy the user's selected charging criterion for balancing stored charges in the apparatus' own battery and in the second device's rechargeable battery for the profile of power consumption of both the apparatus and second device for the selected use case; and
control power flow between the apparatus and second device, by transmitting power provided by the apparatus' own battery, to the second device, for charging the second device's rechargeable battery until the present level of stored battery charge in the second device's rechargeable battery reaches the computed amount of charging required, if charging of the second device's rechargeable battery is determined to be required, and by receiving power from the second device, provided by the second device's rechargeable battery, for charging the apparatus' rechargeable battery until the present level of stored battery charge in the apparatus' rechargeable battery reaches the computed amount of charging required, if charging of the apparatus' rechargeable battery is determined to be required.

11. The apparatus of claim 10, further comprising:
the at least one memory and the computer program code configured to, with the at least one processor, cause the apparatus at least to:

transmit to the second device, a request for stored battery charge data describing a current state of the rechargeable battery in the second device;
receive stored battery charge data from the second device describing the current state of its rechargeable battery;
access a database, to retrieve battery characteristic data for the second device's rechargeable battery;
compare the stored battery charge data received from the second device with a recharging threshold; and
determine that recharging of the second device's rechargeable battery is required, based on the comparison.

12. The apparatus of claim 10, further comprising:
the at least one memory and the computer program code configured to, with the at least one processor, cause the apparatus at least to:
monitor a present level of stored battery charge in the second device's rechargeable battery and a present level of stored battery charge in the apparatus' own battery; and
terminate the transmitting of power to the second device, when the present level of stored battery charge in the second device's rechargeable battery reaches the computed amount of charging required for the second device's rechargeable battery.

13. The apparatus of claim 11, further comprising:
wherein the retrieved battery characteristic data for the second device's rechargeable battery, includes battery maximum capacity and recharging threshold data, for the second device's rechargeable battery.

14. The apparatus of claim 11, further comprising:
wherein the recharging threshold includes an accessed battery maximum capacity and an accessed recharging threshold data for the second device's rechargeable battery.

15. The apparatus of claim 10, further comprising:
wherein the computing of the amount of charging required for the second device's rechargeable battery is based on the received stored battery charge data describing the second device's rechargeable battery, an accessed maximum capacity of the second device's rechargeable battery, and stored battery charge in the apparatus' battery.

16. The apparatus of claim 10, further comprising:
the at least one memory and the computer program code configured to, with the at least one processor, cause the apparatus at least to:
access a database, to retrieve battery characteristic data for at least one of the apparatus' battery or the second device's battery, including at least one profile of different power consumption with different use cases; and
compute the amount of charging required for the second device's rechargeable battery, based on the at least one profile of different power consumption with different use cases.

17. The apparatus of claim 10, further comprising:
wherein the power provided by the first device's own battery, to the second device, is at least one of power transmitted wirelessly to the second device or power transmitted via a wire to the second device.

18. The apparatus of claim 10, further comprising:
wherein the first device is either mobile or stationary and the second device is either mobile or stationary.

* * * * *